US008875076B2

(12) United States Patent
Lin et al.

(10) Patent No.: US 8,875,076 B2
(45) Date of Patent: Oct. 28, 2014

(54) SYSTEM AND METHODS FOR CONVERTING PLANAR DESIGN TO FINFET DESIGN

(71) Applicant: Taiwan Semiconductor Manufacturing Company, Ltd., Hsinchu (TW)

(72) Inventors: Yi-Tang Lin, Hsinchu (TW); Cheok-Kei Lei, Andar AC, MO (US); Shu-Yu Chen, Hsinchu (TW); Yu-Ning Chang, Hsinchu (TW); Hsiao-Hui Chen, Hsinchu (TW); Chih-Sheng Chang, Hsinchu (TW); Chien-Wen Chen, Hsinchu (TW); Clement Hsingjen Wann, Carmel, NY (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 14/229,134

(22) Filed: Mar. 28, 2014

(65) Prior Publication Data
US 2014/0215420 A1 Jul. 31, 2014

Related U.S. Application Data

(63) Continuation of application No. 13/416,742, filed on Mar. 9, 2012, now Pat. No. 8,726,220.

(60) Provisional application No. 61/480,470, filed on Apr. 29, 2011.

(51) Int. Cl.
*G06F 17/50* (2006.01)

(52) U.S. Cl.
CPC .................................. *G06F 17/5081* (2013.01)
USPC ........................................................ 716/111

(58) Field of Classification Search
USPC ........................................................ 716/111
See application file for complete search history.

(56) References Cited

U.S. PATENT DOCUMENTS

| 7,315,994 | B2 | | 1/2008 | Aller et al. | |
|---|---|---|---|---|---|
| 8,286,114 | B2 | | 10/2012 | Chuang et al. | |
| 8,621,406 | B2 | * | 12/2013 | Lei et al. | 716/110 |
| 8,726,220 | B2 | * | 5/2014 | Lin et al. | 716/135 |
| 2008/0263492 | A1 | | 10/2008 | Chuang et al. | |
| 2012/0273899 | A1 | * | 11/2012 | Wann et al. | 257/401 |
| 2012/0278776 | A1 | * | 11/2012 | Lei et al. | 716/111 |
| 2012/0278777 | A1 | * | 11/2012 | Lin et al. | 716/111 |
| 2012/0278781 | A1 | * | 11/2012 | Wann et al. | 716/122 |

* cited by examiner

*Primary Examiner* — Suchin Parihar
(74) *Attorney, Agent, or Firm* — Lowe Hauptman & Ham, LLP

(57) ABSTRACT

A method and layout generating machine for generating a layout for a device having FinFETs from a first layout for a device having planar transistors are disclosed. A planar layout with a plurality of FinFET active areas is received and corresponding FinFET active areas are generated with active area widths. Mandrels are generated according to the active area widths and adjusted such that a beta ratio of a beta number for each FinFET active area to a beta number for each corresponding planar active area is within a predetermined beta ratio range.

20 Claims, 21 Drawing Sheets

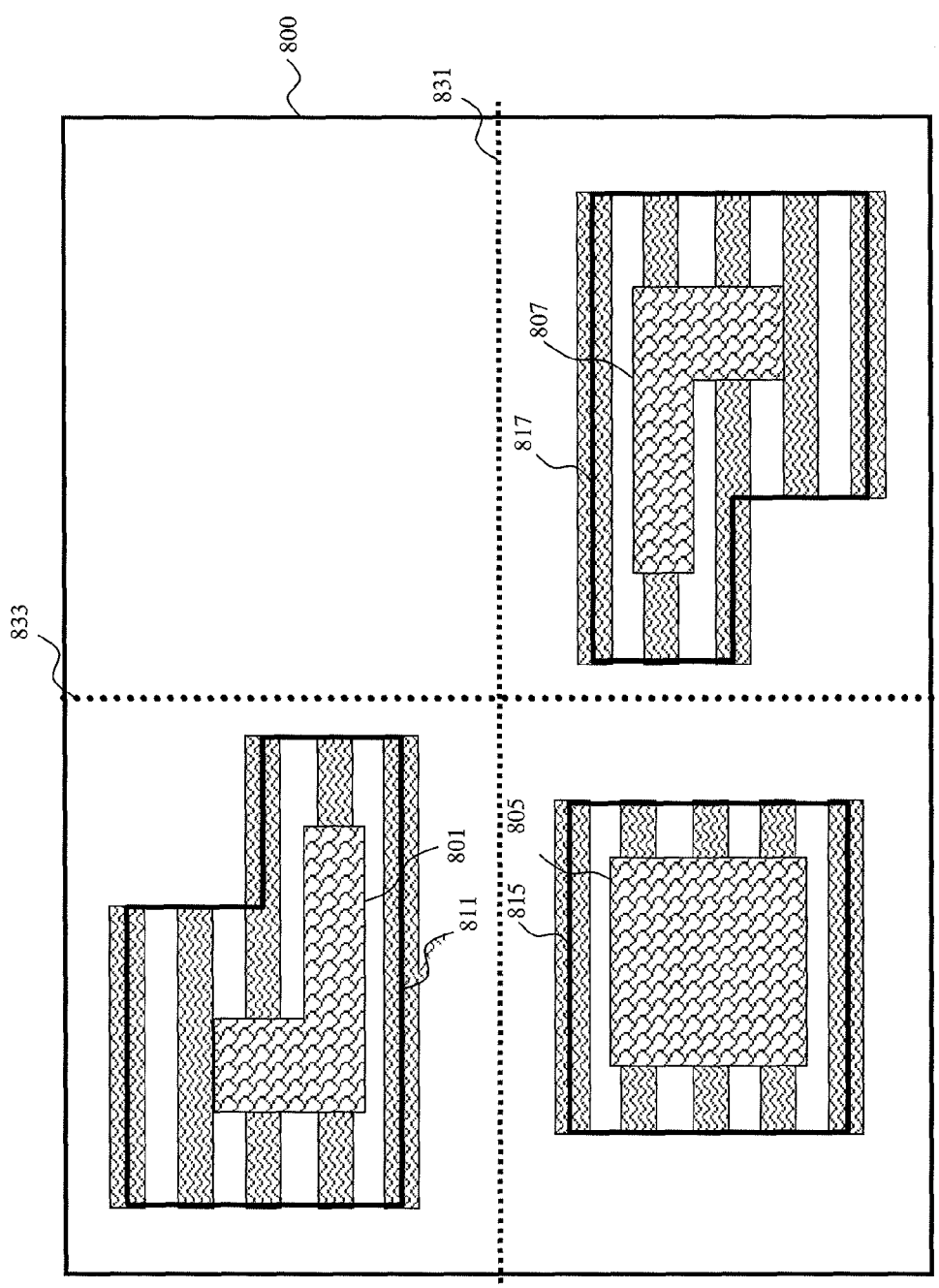

US 8,875,076 B2

SYSTEM AND METHODS FOR CONVERTING PLANAR DESIGN TO FINFET DESIGN

PRIORITY CLAIM

The present application is a continuation of U.S. application Ser. No. 13/416,742, filed Mar. 9, 2012, which claims priority of U.S. Provisional Application No. 61/480,470, filed Apr. 29, 2011, which are incorporated herein by reference in their entireties.

TECHNICAL FIELD

The disclosure relates generally to design and fabrication of integrated circuit devices, and more particularly to systems and methods for forming fin field-effect transistor (FinFET) devices.

BACKGROUND

In the rapidly advancing semiconductor manufacturing industry, complementary metal oxide semiconductor (CMOS) FinFET devices are increasingly used in many logic and other applications and are integrated into various different types of semiconductor devices. FinFET devices typically include semiconductor fins with high aspect ratios in which the channel and source/drain regions for the transistor are formed. A gate is formed over and along the sides of a portion of the semiconductor fins. The use of fins increases surface areas of the channel and source/drain regions for the same area. The increased surface area of the in a FinFET results in faster, more reliable and better-controlled semiconductor transistor devices that consumes less power.

New advanced designs are created with FinFET structures at the outset with computed-aided design (CAD) layers that define the boundary of each FinFET. As manufacturing process progresses into smaller and smaller technology nodes, devices originally designed in a larger technology node may benefit from manufacturing in a smaller technology node in ways such as increased performance and efficiencies and decreased die size. Similarly, devices designed using planar transistors can also reap benefits by manufacturing using FinFETs. However, because different design rules apply to planar structure layouts and FinFET structure layouts, converting portions of the device from a planar layout to a FinFET layout by hand may be akin to creating a new design and is a highly resource intensive process. For product already being manufactured using planar transistors, a conversion that includes changes to semiconductor layers above the transistor level would require many new photomasks to be created, which dramatically increases manufacturing cost.

As such, improved methods for automatically converting planar structure layouts to FinFET structure layouts continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3-8 illustrate various examples of FinFET cell and FinFET boundary matching for mandrel generation according to various embodiments of the present disclosure.

DETAILED DESCRIPTION

Figure 1A:
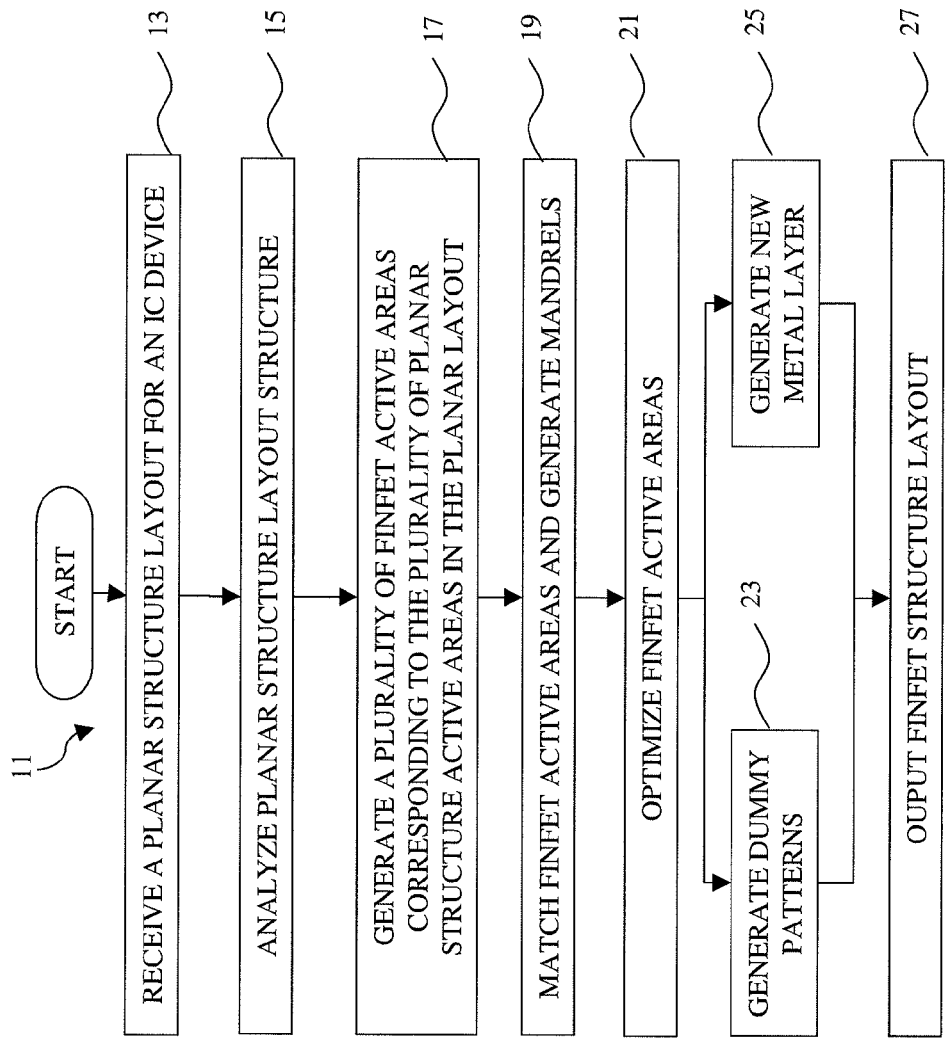
FIG. 1A illustrates a flowchart of a method for converting a planar structure layout to a FinFET structure layout in accordance with certain embodiments of the present disclosure.

The making and using of illustrative embodiments are discussed in detail below. It should be appreciated, however, that the disclosure provides many applicable inventive concepts that can be embodied in a wide variety of specific contexts. Specific examples of components and arrangements are described below to simplify the present disclosure. These are, of course, merely examples and are not intended to be limiting. For example, the formation of a first feature over or above a second feature in the description that follows may include embodiments in which the first and second features are formed in direct contact, and may also include embodiments in which additional features may be formed between the first and second features, such that the first and second features may not be in direct contact. Of course, the description may specifically state whether the features are directly in contact with each other. In addition, the present disclosure may repeat reference numerals and/or letters in the various examples. This repetition is for the purpose of simplicity and clarity and does not in itself dictate a relationship between the various embodiments and/or configurations discussed. The specific embodiments discussed are merely illustrative and do not limit the scope of the invention.

Fin field-effect transistors (FinFETs) use a substantially rectangular fin structure formed generally in one of two ways. In a first method, bulk silicon on a substrate is etched into a rectangular fin shape by first patterning and depositing a hardmask layer on the bulk silicon. The hardmask forms a pattern covering the top of the fins. The bulk silicon is then etched to form trenches between the regions covered by the hardmask layer. The trenches are formed into shallow trench isolation (STI) features by depositing a dielectric material, usually silicon oxide, into the trench. The dielectric material is usually deposited in excess to completely cover the fins and optionally the hardmask layer if not already removed. The dielectric material is planarized down to the top surface of the fin/hardmask, and then etched to a level below the top of the fin so that a portion of the fin protrudes above the STI.

In a second method, the STI features are formed first on bulk silicon material by depositing an STI layer and etching trenches into it. The bottoms of the trenches between the STI features are exposed bulk silicon. Silicon is then grown in the trenches to form the fins by using, for example, an epitaxial process. Once a desired fin height is reached, then the STI is etched to a level below the top of the fin to expose a portion of the fin. The bulk silicon material may be a silicon substrate or a deposited silicon such as silicon-on-insulator (SOI) with a barrier oxide (BOX) layer between the SOI and the underlying silicon substrate.

In a variation of the first method, the hardmask for etching in to the bulk silicon is formed by a process using mandrels. A photoresist pattern is formed and used to etch a mandrel pattern. A conformal spacer material is then deposited around the mandrel. The conformal spacer is usually formed of a hardmask material forming a spacer sidewall thinner than that of the mandrel. The mandrel material between the spacers is then removed in subsequent etching operations to leave just the spacers behind. Some of the spacers are then used as a hardmask for etching the silicon layers below, forming the fin structures. Using the mandrel/spacer method, thinner fins that are closer together can be formed than an unmodified, conventional first method.

Systems and methods to automatically convert planar structure layouts to FinFET structure layouts in accordance with various embodiments of the present disclosure use the first method variation with mandrels, although other methods may be used, such as the first method using mandrels. Various performance gains may be garnered by converting a planar transistor to a FinFET. However, for an existing product, the cost of making photomasks and re-design for all the layers is very high; hence, it is important to re-use as many photomasks from an existing product as possible. Particularly, changes to layouts of layers above the transistor level are to be avoided to minimize the number of new photomasks created and minimize the number of re-designed layers.

Figure 1B:
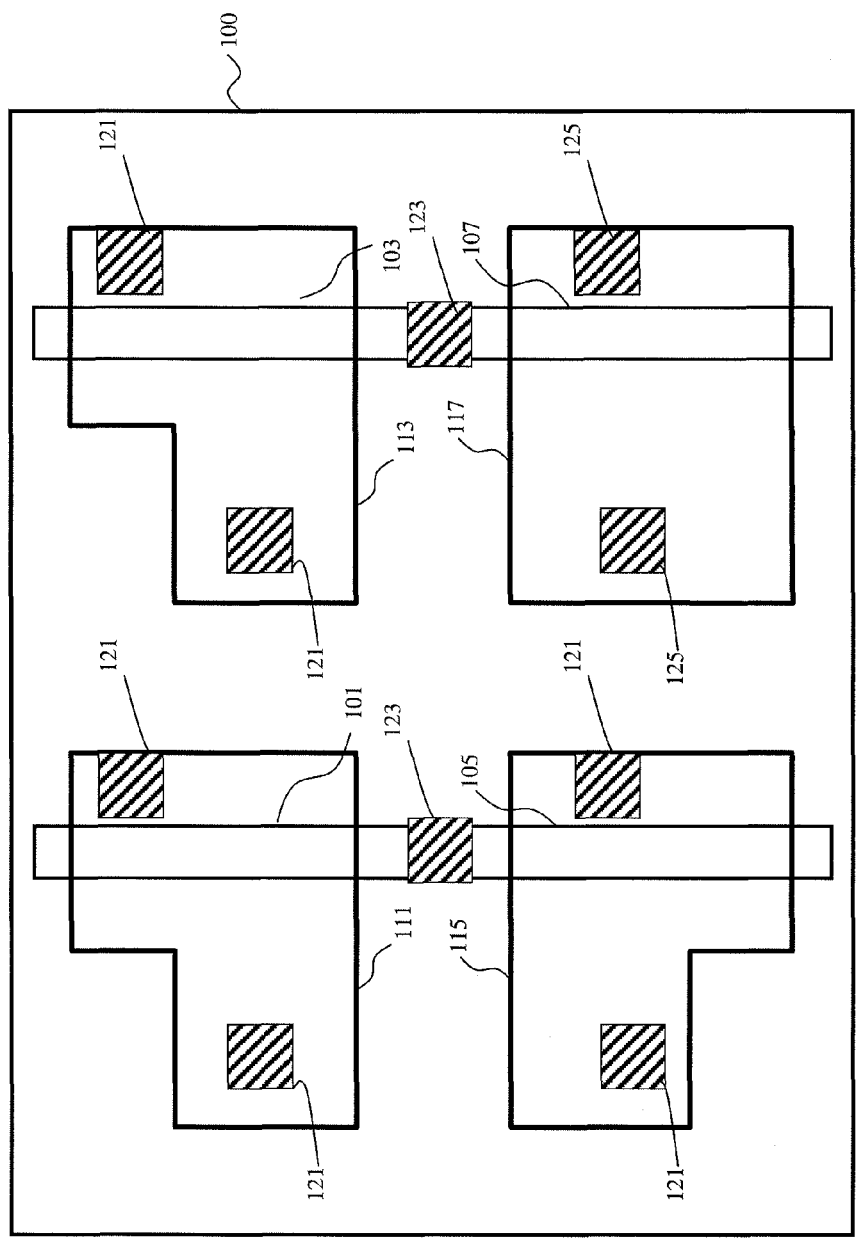
FIG. 1B illustrates a portion of a planar structure layout.

FIG. 1A illustrates a semiconductor process flow 11 to generate an integrated circuit (IC) design for manufacturing FinFET structures using planar structure layouts that can minimize the number of new photomasks and provide a FinFET layout structure that includes the benefits of using FinFETs. In operation 13, a planar structure layout is received for an IC design. An IC design includes the planar structure layout of the entire chip. Depending on the type of IC, the design may include logic cells, analog cells, memory, such as static random access memory, periphery input/output for these cells, and input/output cells for the entire chip. FIG. 1B is an example of a portion 100 of a planar structure layout. The planar structure layout includes planar active areas 111, 113, and 115, planar dummy area 117, and other features such as gates (101, 103, 105, 107 (dummy gate) and contacts 121 for each of the planar active areas, the gate (123) and for the planar dummy areas (contacts 125). Generally, each active area forms one transistor, which may have a p-type or an n-type conductivity. For example, planar active areas 111 and 115 shares a gate structure (101 and 105) and may have opposite conductivities such that one transistor, for example, 111, has p-type conductivity and the other transistor, for example 115, has n-type conductivity.

In operation 15, the planar structure layout is analyzed. Various analyses may be performed. For example, if the planar structure is provided without an associated hierarchical tree, also referred to as a flattened layout, then the planar structure layout is analyzed to extract a hierarchical list and tree. The tree may be extracted by dividing the layout into cells, which may include one or more planar active areas, and grouping the cells by depth and connectivity. Cells in the different groups may be independent from each other logically. However, it is recognized that the some cells are re-used many times in IC design, sometimes in different hierarchical orders. The re-used cells would contain planar active areas having a same size and shape; however, the cells may be rotated, translated, or be a mirror image of the original cell.

Figure 3:
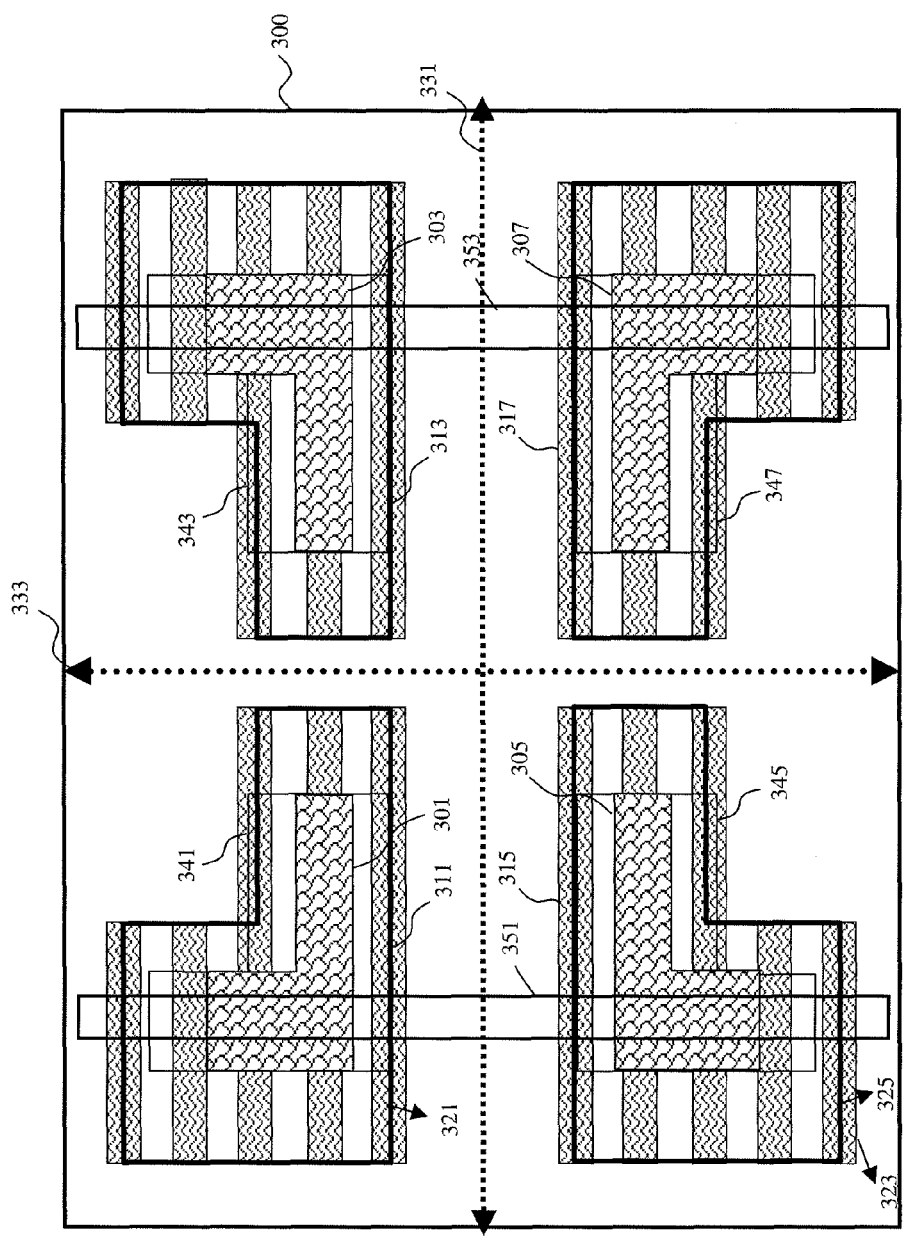

In operation 17, FinFET active areas corresponding to the planar active areas in the planar structure layout are generated. The FinFET active areas may be initially generated to have the same size as the planar active areas. Because the FinFET uses three-dimensions instead of two for the planar transistor, the effective FinFET width is longer than the planar transistor having the same size layout area. In other words, the FinFET active area may be smaller than the planar transistor and still maintain advantageous transistor properties. Generally, the FinFET active areas are the same size or smaller than corresponding planar active areas. Because different design rules apply to planar structure layout and to FinFET structure layout, the generated FinFET active areas are often changed based on the design rules. For example, two active areas may be too close in the FinFET layout but not so in the planar layout. FIG. 3 shows some examples of planar active areas (341, 343, 345, and 347) and corresponding FinFET active areas (301, 303, 305, and 307). In each of the examples, the FinFET active area widths are smaller than the planar active area width from which the FinFET active areas are generated; however, the length of the active areas are the same.

In operation 19, the FinFET active areas are matched and mandrels in each FinFET active areas are generated. Because the number and location of fins can affect electrical properties of a FinFET, the FinFET active areas are matched, as closely as possible, whenever a symmetrical pattern is detected from the planar structure layout. The symmetrical pattern may be by reflection, as in mirror images, by rotation, in a rotated image, or translation. In one example, a planar cell may include a number of planar active areas that are exactly the same. The corresponding FinFET active areas are then matched, as much as possible, to have exactly the same number and location of fins inside each FinFET active area so that the electrical properties and layout environment of each FinFET are also the same. In another example, a planar cell may include planar active areas that are mirror images of each other. The corresponding FinFET active areas are then also matched so that the patterns of fins are mirror images across the same cell mirror line. In yet another example, a planar cell may include planar active areas that are rotated images of each other. The corresponding FinFET active areas are then also matched so that the patterns of fins are rotated images of each other.

The matching may be done from cell to cell or active area to active area. Thus, a number of planar cells may be exactly the same having corresponding FinFET cells that are also matched so that they have the same number and location of fins. Planar cells may be mirror images or rotated images of each other. In these cases, the corresponding FinFET cells are matched so that fins therein have the same number at the mirror image or rotated locations.

Figure 2:
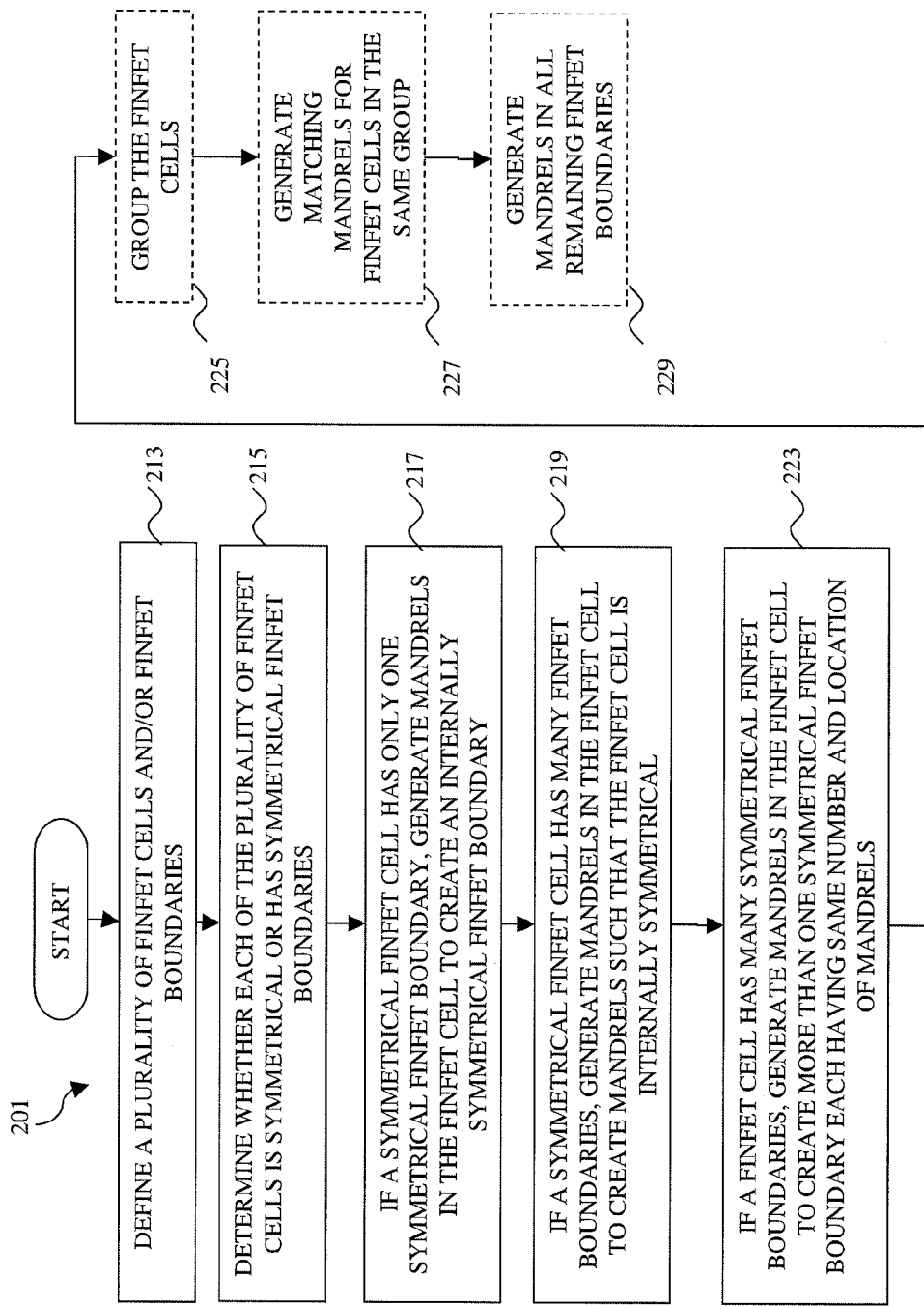
FIG. 2 illustrates a flowchart of a method for generating mandrels and other FinFET features for matching planar and FinFET structures in accordance with various embodiments of the present disclosure.

FIG. 2 illustrates the FinFET active area matching and mandrel generating process for a semiconductor manufacturer. A semiconductor manufacturer may or may not have access to the hierarchical structure of the IC design, and hence may not have the cell information from the planar structure layout. As discussed above, a planar structure layout may be analyzed to determine the cell and hierarchical information. However, many sets of cells and hierarchical information may be used to validly describe the same planar structure layout. Thus, the process for matching cells may be different for the semiconductor manufacturer and the IC designer, the former sometimes does not have the hierarchical information for the IC design or a part of the IC design.

In operation 213, the FinFET cells and/or FinFET boundaries are defined using the FinFET active areas generated in operation 17 of FIG. 1A. A FinFET cell, like the FinFET boundary, can include one or more FinFET active areas. A FinFET cell can also include one or more FinFET boundaries. The difference between a FinFET cell and a FinFET boundary is how mandrels are generated within. A FinFET boundary can have only one mandrel generation point. All of the FinFET active areas, if more than one, in a FinFET boundary are bound together by design rules to share a set of equally spaced fins. In other words, having separately generated fins in the FinFET active areas of one FinFET boundary would violate design rules such as spacing and width. As an example, one FinFET boundary may include two FinFET active areas that are too close together either in the channel direction (parallel to the fins) or channel width direction (parallel to the gate). These FinFET active areas are then defined into a FinFET boundary.

In operation 215, each FinFET cell is analyzed to determine whether it is symmetrical or has symmetrical FinFET boundaries. Depending on the result, the mandrels are generated differently within the FinFET cell.

FIG. 3 illustrates a symmetric FinFET cell 300 having four FinFET active areas 301, 303, 305, and 307 with different kinds of symmetry. The four FinFET active areas are enclosed by FinFET boundaries 311, 313, 315, and 317. FinFET active area 303 is a mirror image of FinFET active area 301, with a mirror line 333 in the channel width direction. The channel direction crosses the gates and thus is perpendicular to gates 351 and 353. The channel width direction is perpendicular to the channel direction and parallel to gates 351 and 353. FinFET active area 305 is a mirror image of FinFET active area 301, with a mirror line 331 in the channel direction (perpendicular to gates 351 and 353). FinFET active area 305 is also a 180 degree rotated image of FinFET active area 303. FinFET active area 307 is a mirror image of FinFET active area 303 or 305, with a mirror line 331 in the channel direction for 303 or with a mirror line 333 in the channel width direction for 305. FinFET active area 307 is also a 180 degree rotated image of FinFET active area 301. FinFET cell 300 is symmetrical because these FinFET active areas are all symmetrical either by rotation or by reflection. Note that 100% symmetry may not be required. If the FinFET active areas are substantially symmetrical, say over 85% or over 90% symmetrical, then the mandrels may be generated in a matched manner.

Another method to determine whether the FinFET cell is symmetrical involves comparing various points in the FinFET cell across different center lines, for example, mirror lines 331 and 333. If the FinFET cell has reflection symmetry, then points across one of the center lines should be the same. In the example of FinFET cell 300, points across either center line are the same. If a FinFET cell or a FinFET boundary has reflection symmetry about a center line, then the center line is a mirror line. Depending on the technology node, a sufficient number of sample points are compared to ensure symmetrical, though absolute symmetry may not be required. For example, if over 85% or over 90% of the sample points are the same, the FinFET cell may be said to be symmetrical and the mandrels may be generated in a matched manner.

To match the mandrels and thereby ensure that these FinFET active areas will have similar electrical properties, the mandrels are generated such that the mandrels within the FinFET active areas are the same if the FinFET active areas are flipped back or rotated back to the original image. In other words, the longer mandrels are all spaced equally from the longer edge of the FinFET active area. Because the mandrel pitch is the same in all FinFET boundaries, if the longer mandrel is generated to space equally from the longer edge of the FinFET active area, all other mandrels are also matched.

One method of mandrel generation is to generate mandrels from a mandrel generation point. The first edge mandrel is generated from the mandrel generation point to the right to the next corner of the FinFET boundary. Successive mandrels are generated upwards according to specified mandrel pitch, which is defined based on the technology node and lithography techniques used. Using this method, if the lower left corner of the FinFET boundary is always selected as the mandrel generation point, unmatched mandrels would be generated in FinFET boundaries 311 and 315. Thus, in order to match the mandrels, the mandrel generation is shifted to ensure matching. Using FinFET boundaries 311 and 315 as examples, if points 321 and 323, both lower left corners of FinFET boundaries, are used as a generation points, the resulting mandrels would not be matched in FinFET active areas 301 and 305. If however, the generation point for FinFET boundary 315 is shifted to point 325, then the resulting mandrels would match, as is shown in FIG. 3.

Figure 4:
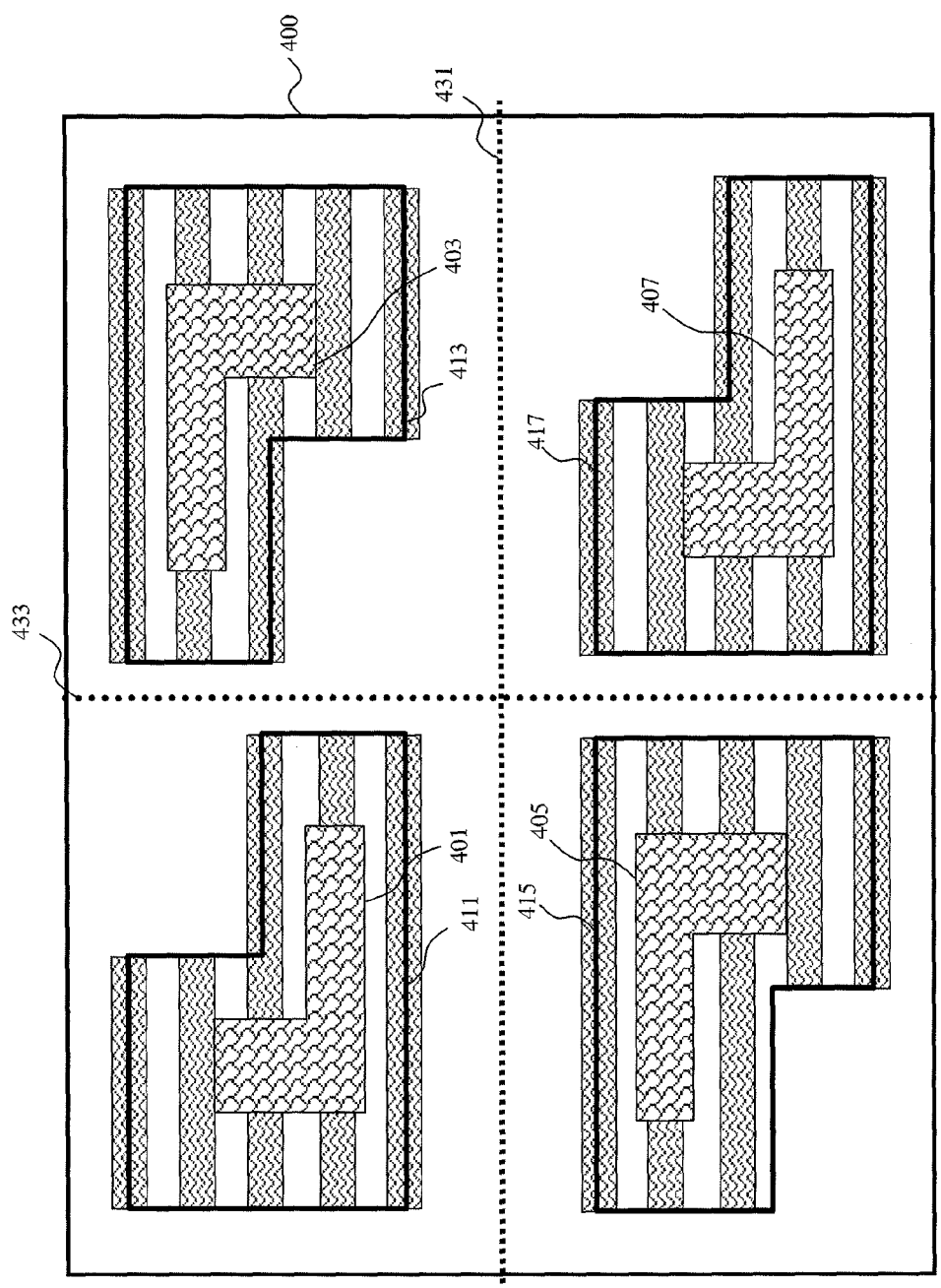

FIG. 4 shows another symmetrical FinFET cell 400 having four FinFET active areas 401, 403, 405, and 407 with different kinds of symmetry. The four FinFET active areas are enclosed by FinFET boundaries 411, 413, 415, and 417. The FinFET active area 401 and FinFET boundary 411 have translation symmetry with FinFET active area 407 and FinFET boundary 417. The FinFET active area 403 and FinFET boundary 413 have translation symmetry with FinFET active area 405 and FinFET boundary 415. FinFET active areas 403 and 405, along with FinFET boundaries 413 and 415 are also 180 degrees rotated images of FinFET active area 401 and FinFET boundary 411. Note that in FinFET cell 400, there is no symmetry across center lines 431 and 433. FinFET cell 400 is symmetrical because these FinFET boundaries are all symmetrical either by translation or by rotation. Note that 100% symmetry may not be required. If the FinFET active areas are substantially symmetrical, say over 85% or over 90% symmetrical, then the mandrels may be generated in a matched manner.

Figure 5A:
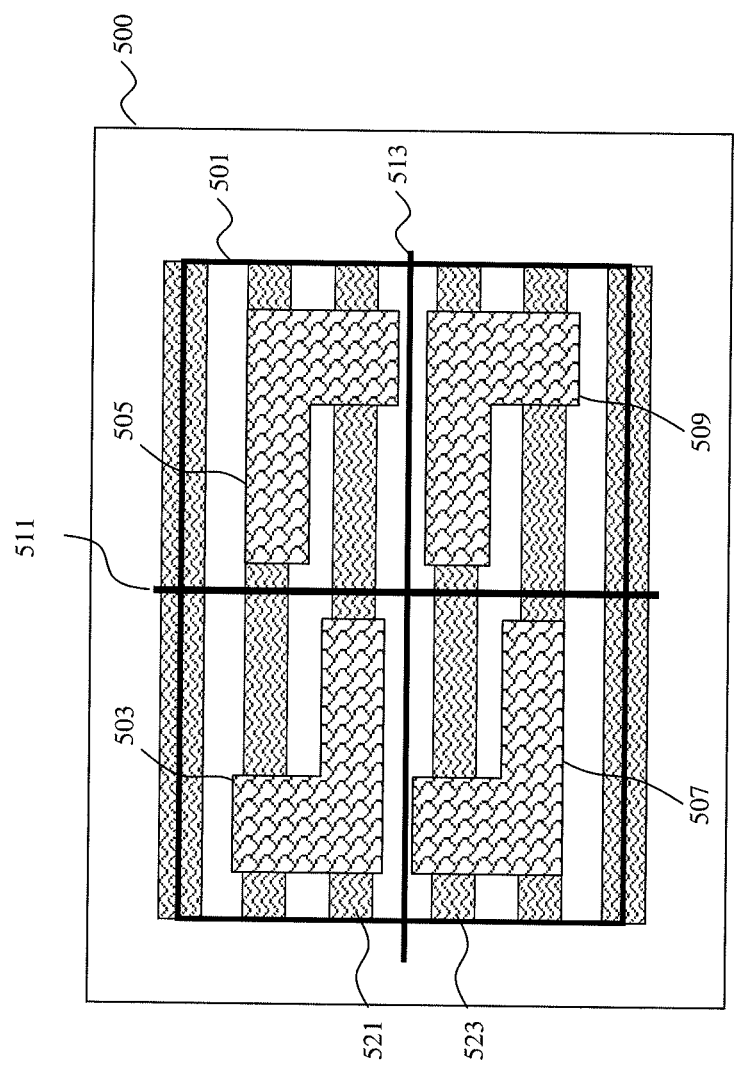
Figure 5B:
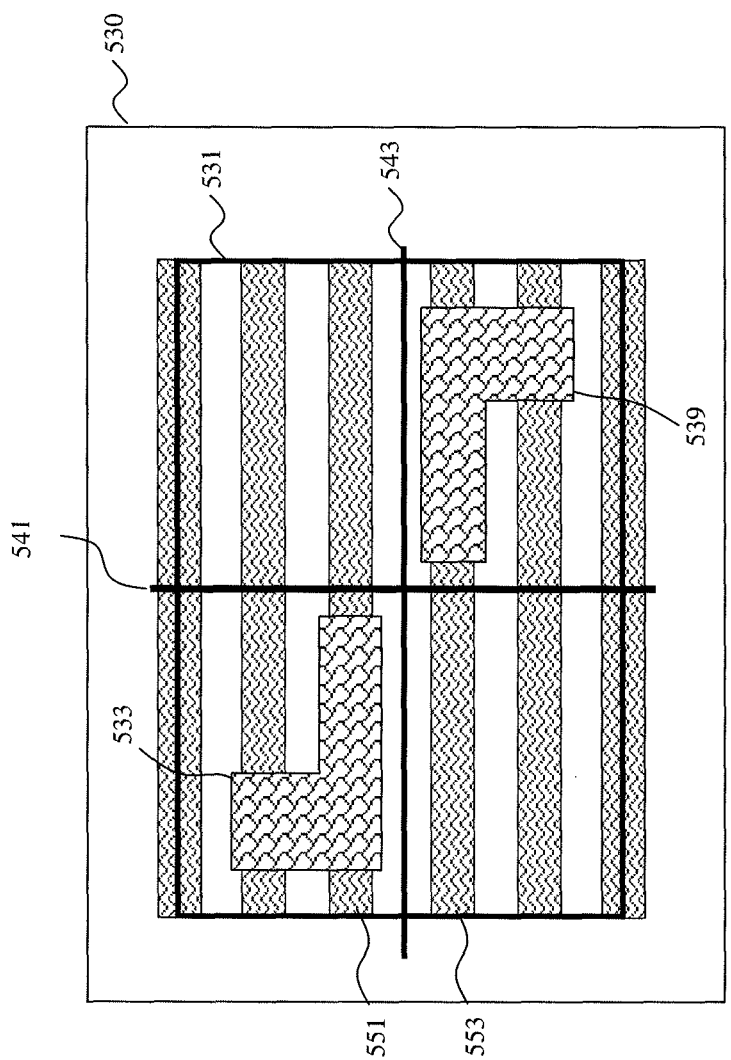

FIGS. 5A and 5B show FinFET cells 500 and 530 with only one FinFET boundary 501 and 531, respectively. In FIG. 5A, the FinFET boundary 501 includes four FinFET active areas 503, 505, 507, and 509. FinFET cell 500 and FinFET boundary 501 are not symmetrical. Note that this FinFET boundary is not symmetrical by reflection because mirror images are not formed across center lines 511 and 513. However, FinFET active areas 505 and 509 are rotated images of FinFET active area 503 and similarly FinFET active areas 503 and 507 are also rotated images of 505. The FinFET active areas in the FinFET cell cannot all be generated in a matched manner because they share a FinFET boundary.

If the FinFET boundary contained only FinFET active areas 503 and 509, or only FinFET active areas 505 and 507, the active areas may be matched by generated mandrels from the center line 513. As depicted in FIG. 5A, the long side edges of the FinFET active areas 503 and 509 are equidistant from respective mandrels 521 and 523. But FinFET active area 507 cannot be made to match FinFET active areas 503 and 509 cannot be made to match FinFET active area 505 even though these FinFET active areas would be symmetrical if they were in different FinFET boundaries. In this situation the FinFET active areas can be matched if they can be separated enough to be placed in different FinFET boundaries, for example, 503 and 509 in one FinFET boundary and FinFET active areas 505 and 507 in another. In many cases a separation would either be not possible due to interference with nearby features causing other FinFET boundaries to merge or cause even more problems because associated features may also need to move, for example, contacts may need to be rerouted as a result. Thus, the method would evaluate whether separation is possible and, if not, generate the mandrels so that at least two of the FinFET active areas have matching mandrels.

FIG. 5B shows a FinFET boundary 531 containing two FinFET active areas 533 and 539 where the FinFET active areas can be matched. The active areas 533 and 539 may be matched by generated mandrels from the center line 543 because the FinFET active areas are rotated images of each other. As depicted in FIG. 5B, the long side edges of the FinFET active areas 533 and 539 are equidistant from respective mandrels 551 and 553. Without additional FinFET active areas within the FinFET boundary, the mandrels in FIG. 5B can be adjusted so that the FinFET active areas match.

In the case where a mirror line exists in a FinFET boundary, a FinFET boundary shift is calculated to find a FinFET generation point from which symmetrical mandrels can be generated across a mirror line. On the mirror line may be placed a mandrel center, a mandrel space center (space between two mandrels), or a fin (a calculated distance from a mandrel edge). Considering the final FinFET structure, the mirror line is a line where the features above it and below it are substantially the same. Thus, the line cannot arbitrarily cut cross a feature but may divide a feature in half. Thus the half feature above the line and below the line are substantially the same. Features that may be cut in half are mandrels and fins. While a fin is not a part of the FinFET layout at this stage in the manufacturing process, a calculation can be made so that a fin centers on the mirror line by calculating an offset from a mandrel edge. The FinFET boundary shift is calculated to shift the mandrel generation point so that the desired feature is placed on the mirror line.

Figure 6:
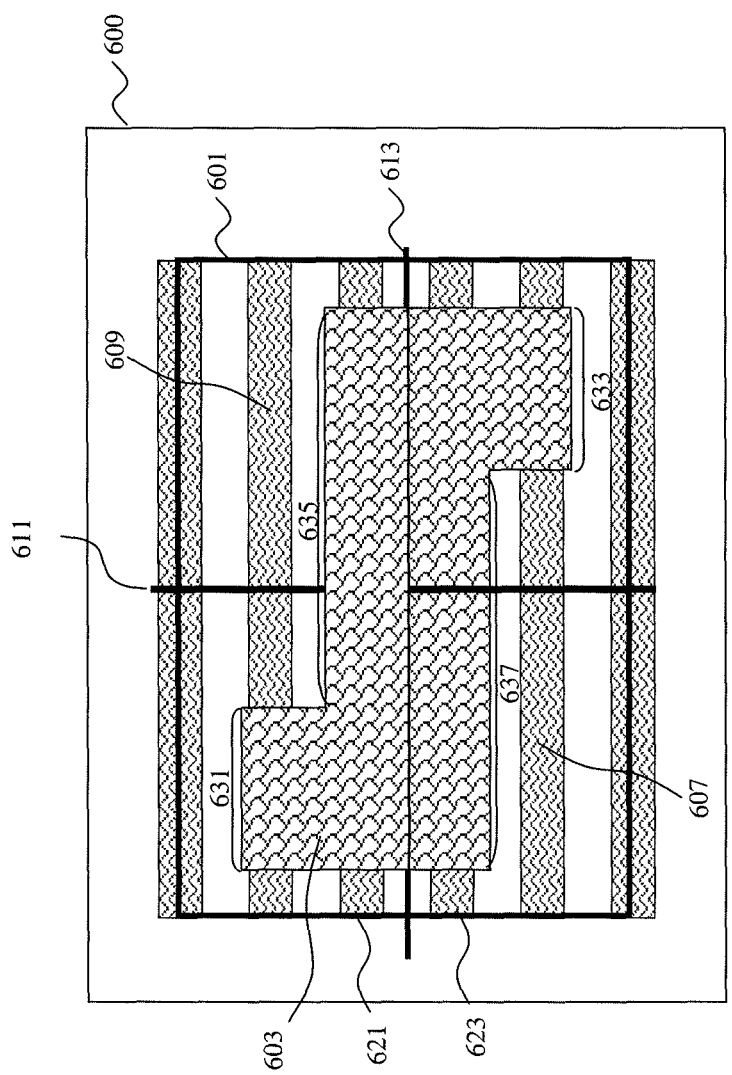

Referring back to FIG. 2, if either the FinFET cell found to be symmetrical and/or has symmetrical FinFET boundaries in operation 215, three possibilities are shown on FIG. 2, depending on the number of FinFET active areas in the FinFET cell and the number of FinFET boundary areas in the FinFET cell. In operation 217, if a symmetrical FinFET cell has only one symmetrical FinFET boundary, mandrels are generated in the FinFET cell to create an internally symmetrical FinFET boundary. FIG. 6 illustrates an example of operation 217. In FIG. 6, FinFET cell 600 includes only one FinFET boundary 601 with one FinFET active area 603. FinFET active area 603 is symmetrical by rotation; portions of FinFET active area 603 across center lines 611 or 613 are rotated images of each other. Thus, the mandrels are generated to create an internally symmetrical FinFET active area, such that edges of mandrels 609 and 607 are the same distance away relative to the "short run" edges (top left 631 and low right 633) of the FinFET active area and mandrels 621 and 623 are the same distance relative to the "long run" edges (top right 635 and low left 637) of the FinFET active area.

Figure 7:
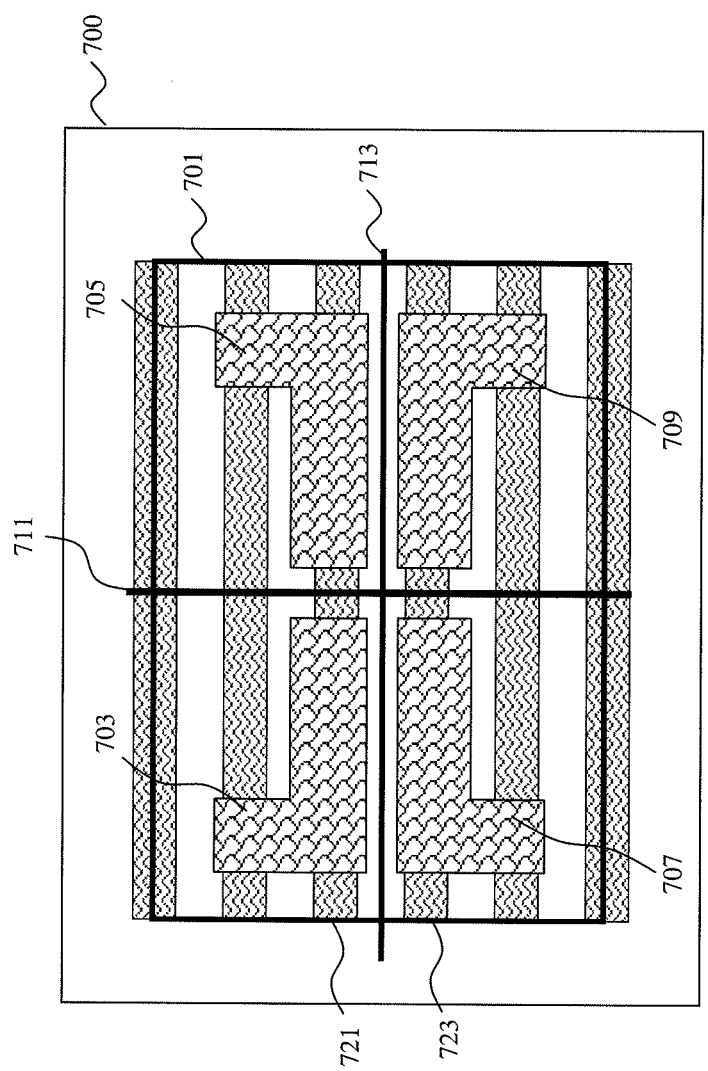

The symmetrical FinFET boundary of operation 217 can also include more than one FinFET active area. FIG. 7 illustrates another example of operation 217. In FIG. 7, FinFET cell 700 includes only one FinFET boundary 701 with four FinFET active areas 703, 705, 707, and 709. FinFET boundary 701 is symmetrical by reflection; portions of FinFET boundary 701 across center lines 711 or 713 are mirror images of each other. Thus, the mandrels are generated to create an internally symmetrical FinFET boundary, such that edges of mandrels 721 and 723 are the same distance away from the mirror line 713 of the FinFET boundary 701 and the resulting FinFET active areas includes the same mandrels in the same locations if the mirror images are flipped back.

Referring back to FIG. 2, in operation 219, if a symmetrical FinFET cell has many FinFET boundaries, generate mandrels in the FinFET cell to create mandrels such that the FinFET cell is internally symmetrical. FIG. 3 is an example of FinFET cells applicable for operation 219. Mandrels are generated in FinFET cell 300 such that FinFET cell 300 is internally symmetrical about the mirror line 331 and about the mirror line 333.

Operation 223 covers the scenario if the FinFET cell is not itself internally symmetrical, but includes symmetrical FinFET boundaries. In operation 223, mandrels are generated in the FinFET cell such that symmetrical FinFET boundaries are created each having same number and location of mandrels. FIG. 4 is an example of such a FinFET cell. Because some of the FinFET boundaries in FIG. 4 are rotated images of other FinFET boundaries, FinFET cell 400 itself is not symmetrical. However, the mandrels are generated so that each FinFET boundary can be flipped back or rotated back to be the same as a symmetrical counterpart.

FIG. 8 is another example of a FinFET cell that is not internally symmetrical but includes symmetrical FinFET boundaries 811, 815, and 817. While FinFET boundaries 811 and 817 are rotated images of each other, FinFET boundary 815 is internally symmetrical. Thus, the mandrels of each of these FinFET boundaries are generated separately to so that the rotated image FinFET boundaries 811 and 817 have mandrels that match. In the FinFET boundary 815, the mandrels are generated so according to an internal mirror line (not shown). Note that in some cases the configuration of FIG. 8 may be grouped into three different FinFET cells instead of one.

Referring back to FIG. 2, in operation 225 the FinFET cells may be grouped. Grouped FinFET cells are identical to each other or having one of the above described symmetrical properties. For example, one FinFET cell may be a rotated image or be a mirror image of another FinFET cell in the same group. In operation 227, the mandrels in each of the FinFET cells in a group may be generated or adjusted so that the mandrels match. In operation 229, mandrels are generated in all remaining FinFET boundaries. Remaining FinFET boundaries are FinFET boundaries that do not have a symmetrical counterpart elsewhere in the layout. The FinFET structure layout including the mandrels may be checked against design rules at this time.

Referring back to FIG. 1A, after all the mandrels have been generated, the remaining operations are referred to as post process. In a post process operation 21, the mandrels, boundaries, or the FinFET active areas are adjusted to optimize the FinFET active areas. The FinFET structure layout including the mandrels may be checked against design rules at this time. A design rule violation may be that a FinFET active area may have only one fin in it. This structure cannot be manufactured because of lithography and etching process limitations. These FinFETs have to be fixed by adding an additional fin. Usually, this can be achieved by shifting the FinFET boundary to avoid forming the single fin FinFET active area or by increasing the FinFET active area size if no space constraints exist. Note that a shifting of the FinFET boundary may cause mandrels in other FinFET active areas in the FinFET boundary to become unmatched but extending the FinFET active area size would not cause a mis-match.

As discussed above, each FinFET active area has a counterpart planar active area in the planar structure layout. Because the FinFET structure changes the electrical properties of the transistor itself, it is desirable to have the electrical properties change by about the same amount for all transistors by optimizing the width and beta ratios.

Transistors in an integrated chip (IC) device may be arranged in rows of equal or similar height. A conversion from planar structure layout to a FinFET structure layout can maintain this height, which should not be confused with the vertical dimension on a chip. The height direction is parallel to the fins of a FinFET and the substrate, as well as perpendicular to the gates. Thus, for FinFET structure layout converted from a planar structure layout, the fin lengths are about the same as the height of the planar transistors. Because of this row construction, the fin lengths are not usually adjusted in a conversion.

The transistor width can be adjusted to optimize electrical properties such as timing and power. Because FinFETs are three-dimensional, the effective widths of the FinFETs are larger than the corresponding planar transistor. In addition to the width of the active area, the effective FinFET width also includes two times the extruded portion of the fins. In other words, the extruded portion of the fins adds to the effective width of the FinFET. Therefore, more fins on a FinFET means a greater width difference compared with the corresponding planar transistor. A FinFET active area width refers to the effective FinFET active area width.

The width ratio is the ratio of a FinFET active area width to a corresponding planar active area width. Changing a FinFET active area width can change the width ratio. A FinFET active area width can be changed by changing the number of fins, by changing the amount of fins that extrude, and by changing the active area size.

A beta number compares the width of a p-type transistor to an n-type transistor in a transistor pair in the IC design. Because a p-type transistor and n-type transistor have different electrical properties, the beta number for a circuit reduces the differences by making opposite conductivity transistors having different widths. A beta ratio is the ratio of the beta number of a FinFET pair to a planar transistor pair.

Both the width ratio and beta ratio are analyzed and optimized to ensure that the resulting FinFET structure layout can achieve desired electrical performance as intended by the IC designer. In other words, the conversion from a planar structure layout to the FinFET structure layout should preserve the relative differences between p-type and n-type transistors and overall improve electrical performance by about the same amount.

Figure 9A:
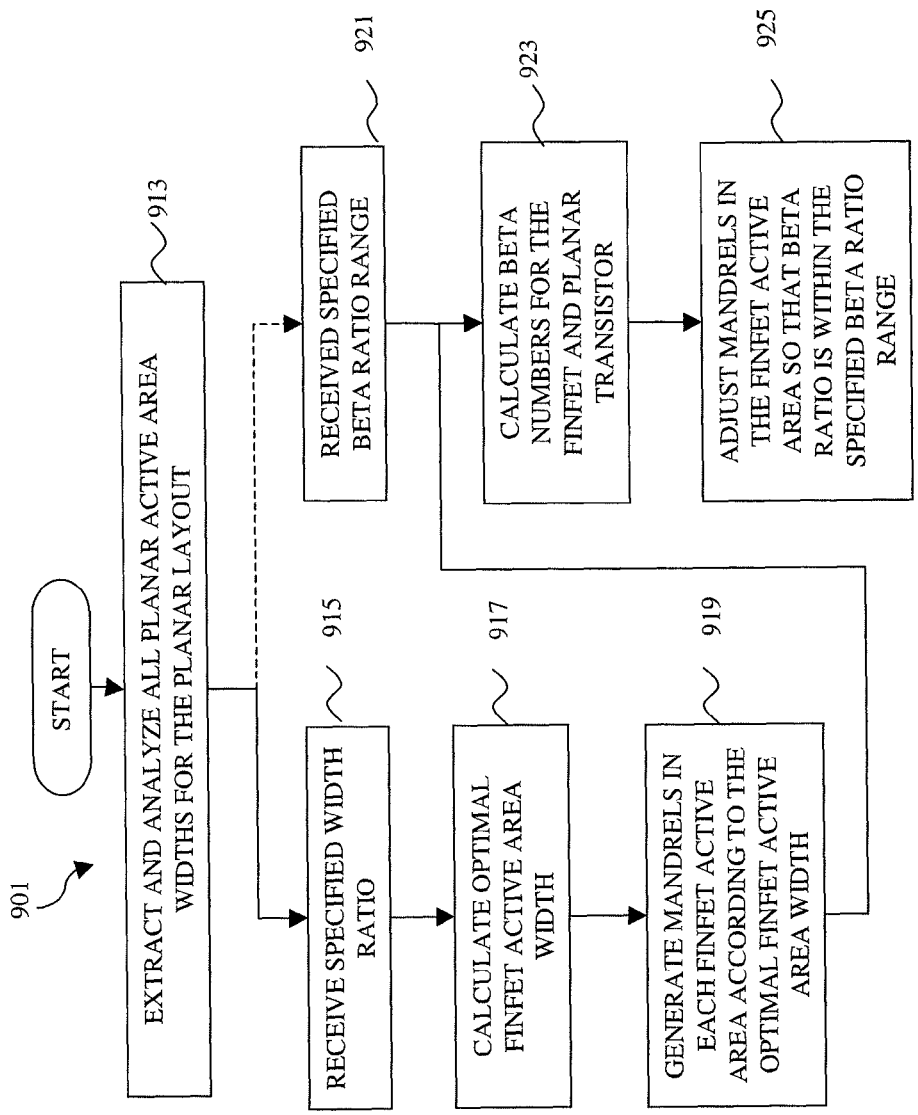
FIG. 9A illustrates a flowchart of a method for optimizing FinFET active areas in accordance with various embodiments of the present disclosure.

Details of the post operation process 21 are shown in FIG. 9A as process 901. In operation 913, the planar active area width for the planar layout are extracted and analyzed. Each planar active area widths are determined. Depending on whether and how well the original planar structure layout followed design rules, this operation may be a simple process because the planar active area widths may have only a few variations with majority of the planar active areas corresponding to one of the variations. However, in many cases the planar active areas have non-rectangular shapes or are not on pitch, requiring more analysis.

In operation 915, a specified width ratio is received. The specified width ratio may be determined by conversion or be an input from an IC designer. Usually, certain performance benefits from the FinFET conversion are desired. An IC designer may provide as input a specified width ratio required to achieve the desired performance benefit, but any width ratio greater than 1 would result in a working device. Further, different specified width ratio may be used for different kinds of functions, such as for logic or memory or analog cells. The specified width ratio can also be a constant in a conversion algorithm, for example, a width ratio of greater than about 1.9, about 1.9, or about 1.8 is determined to provide good electrical property improvement for the FinFET while being achievable for most transistor sizes. As transistor widths decrease, the ability to add another fin to increase the FinFET active area width decreases. For the smallest FinFET having two fins, only a width ratio smaller than 1.9, for example, 1.3, is achievable without dramatically increasing the FinFET active area size. Note that at a width ratio of 1.9, the effective transistor width is increased from the planar version by 90%.

In operation 917, an optimal FinFET active area width is calculated. This optimal width is calculated by multiplying the planar active area width by the specified width ratio. In operation 919, mandrels are generated in each FinFET active area according to the optimal FinFET active area width. The number of mandrels that can be inserted using the standard mandrel pitch in the FinFET active area can be calculated using the planar active area size. Each mandrel forms two fins. A half mandrel can be used to form an odd number of fins for a FinFET active area. In some cases, the FinFET active area may need to be enlarged to generate additional mandrels/fins to meet the width ratio. For other transistors, the FinFET active area size may be reduced because the FinFET active area width exceeds the optimal FinFET active area width.

Enlarging a FinFET active area can only be done if space exists without violating any design rule. According to the design rules, a minimum spacing is required between adjacent FinFET active areas. This minimum spacing also regulates whether a group FinFET active areas must be in the same FinFET boundary, because a smaller spacing is allowed within the FinFET boundary than between boundaries. In some cases, the FinFET active area may be enlarged by merging the FinFET boundary with an adjacent FinFET boundary. In other cases, the FinFET active area may not be enlarged because doing so would violate design rules. A less than optimal FinFET active area width is then used for that FinFET active area.

In a separate set of operations 921 to 925 to be performed in addition or optionally from optimizing using the width ratios, the mandrels are also adjusted and optimized using beta ratios. A specified beta ratio may be received in operation 921. As discussed, a beta number indicates the relative transistor widths between p-type and n-type transistors. The beta ratio indicates the ratio of beta numbers between FinFET and corresponding planar transistors. In order to preserve the relationship between p-type and n-type transistors as designed, the specified beta ratio is generally about 1 or about 1.05. An optimal beta ratio range may be from about 0.85 to about 1.15, or from about 0.7 to about 1.4. Similar to width ratios, the beta ratio may be an input from an IC designer for the conversion, or be a part of the conversion utility. Further, beta ratio ranges may be specified separately for different types of cell functionality, i.e., logic, periphery, or memory cell can each have a different specified beta ratio ranges.

In operation 923, the beta numbers for the FinFET pairs and for the corresponding planar transistor pairs are calculated. The calculation may use optimized FinFET active area widths from operation 919 or from un-optimized FinFET active area widths from the mandrel generation in previous operations, if the beta ratio optimizing occurs first. The beta numbers are ratios of effective widths for transistor pairs, generally the p-type conductivity to n-type conductivity. In most cases the transistor pairings follow simple rules—the opposite conductivity transistors may be located adjacent or across from each other in the same cell. In some cases, the transistor pairing may be found based on connectivity (wiring), the opposite conductivity transistors may not be located right next to each other. In still some other cases, a transistor may appear to be alone. For the single transistor the beta number may be calculated using a particular width or an average width of nearby transistors of the opposite conductivity.

The beta numbers for the FinFET pairs and compared to corresponding planar transistor pairs by calculating a beta ratio of the FinFET beta number to the planar transistor beta number. If the beta ratio is outside of the specified range, then the mandrels are adjusted in the FinFET active area so that the beta ratio is within the specified beta ratio range in operation 925. Adjusting the mandrels includes adding or subtracting fins by moving mandrels, changing the size of the active area to include more or less room for the fins. Note that to increase the beta ratio, one or more fins may be added to the p-type FinFET or removed from the n-type FinFET. To decrease the beta ratio, the opposite may be done.

Figure 9B:
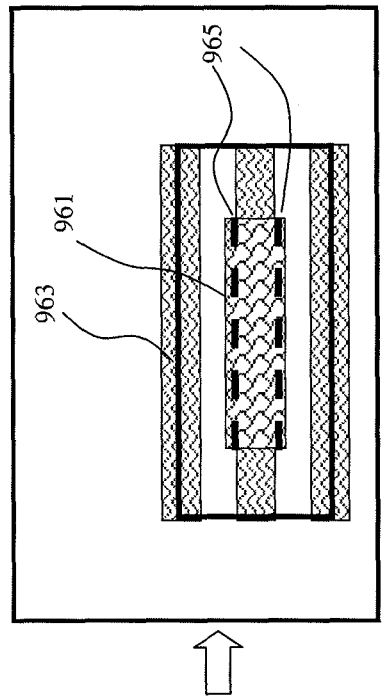
FIGS. 9B-9E illustrate various examples of optimizing FinFET active areas in accordance with various embodiments of the present disclosure.
Figure 9C:
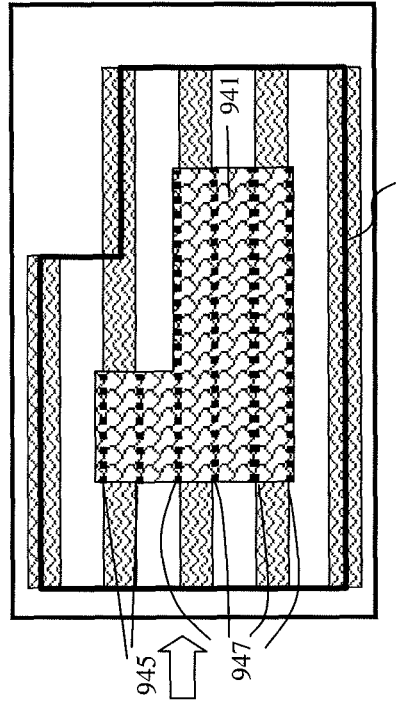

Various operations may be performed to adjust the mandrels. If one or more fins should be added, then the mandrels may be moved by shifting the mandrel generation point to create space for one more fin. This may be accomplished by moving the FinFET boundary. FIGS. 9B and 9C show one example of moving the FinFET boundary creating space for one more fin. FIG. 9B includes a FinFET active area 951 with a FinFET boundary 953. The FinFET active area 951 would create one fin 955, shown in dotted lines, if the mandrels are formed as shown. FIG. 9C shows the same FinFET active area (size and shape) 961 but with a slightly shifted FinFET boundary 963. The configuration of FIG. 9C would create two fins 965 using the same size and shape FinFET active area 961. Shifting the FinFET boundary shifts the mandrel generation point.

In some cases the FinFET boundary cannot be moved because other FinFET active areas are within the same FinFET boundary, thus other FinFET active areas would be affected when the FinFET boundary is moved. In other cases more than one fin should be added. In these cases then the FinFET active area may be extended if space permits under the design rules. If one or more fins may be removed, then the mandrels may also be moved by shifting the mandrel generation point to remove space for one more fin without changing the size of the FinFET active area. The FinFET active area may be made smaller if the width ratio allows. One variation of the mandrel adjusting operation involves a partial extension of the FinFET boundary and FinFET active area. Design rules may not permit extension of the FinFET active area for an entire fin, but in some cases a partial extension may be performed.

Figure 9D:
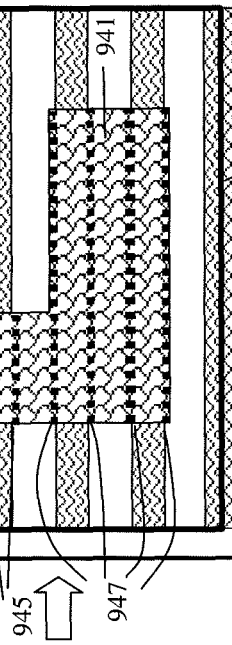
Figure 9E:
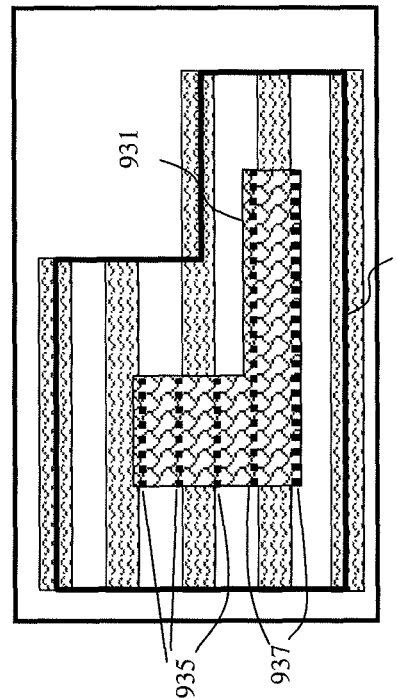

FIGS. 9D and 9E shows an example with a combination of these cases. FIG. 9D includes a FinFET active area 931 with a FinFET boundary 933. The FinFET active area 931 would create 5 fins including 3 short fins 935 and two long fins 937. FIG. 9E shows an extended FinFET active area 941 with an extended FinFET boundary 943. The extension occurs on the top edge. The FinFET active area 941 creates 6 fins, including 2 short fins 945 and 4 long fins 947. The adjustment not only created one extra fin, but also converted a short fin to a long fin by extending the FinFET active area in a direction that has an extrusion resulting in a FinFET active area edge that is shorter than the FinFET active area length.

Optimizing for width ratio and for beta ratio may result in conflicting adjustments. An IC designer may prioritize these modes of optimization to achieve an optimized design by using more than one value. For example, in a first iteration the width ratios may be optimized to a smaller number, say, 1.8, before optimizing the beta ratios using a wider range, say, 0.7 to 1.4. After the beta ratios have been optimized and if no corresponding width ratios are reduced as result, then the beta ratio may be optimized using a narrower range, say, 0.85 to 1.15, or about 1, or the width ratios may be maximized using all available space. After the width ratios have been maximized a final check can be made to make sure that no beta ratio is made too large as result. If a beta ratio exceeds the range maximum then the FinFET mandrels may be adjusted again. Various options are available depending on the design priorities. For example, if the conversion to FinFET structure layout prioritizes lowing power usage as the main goal, then the width ratio may be maximized as long as the beta ratio is within a broad allowable range.

Referring back to FIG. 1A, the FinFET active area optimization of operation 21 may occur at the same time or in a feedback loop with mandrel generation and matching of operation 19. The width and beta ratio optimization may dis-match an optimized FinFET active area from another FinFET active area that was matched in operation 19. In these cases if the spacing and FinFET boundaries allow, the matched FinFET active area may also be adjusted to re-match the optimized FinFET active area. If the matched FinFET active area cannot be adjusted to re-match the optimized FinFET active area by the spacing and FinFET boundaries, then the discrepancy may be reported to the designer, especially if the resulting transistors have significantly different electrical properties.

The FinFET active area optimization of operation 21 may also include steps to deal with non-rectangular FinFET boundaries. Non-rectangular fin boundaries may be extended to a pattern having at least one straight side of fin ends. Other non-rectangular FinFET boundaries, for example, those comprising non-rectangular transistors, may be filtered and reviewed separately to streamline the process.

After the mandrels for all FinFET boundaries enclosing FinFET active areas are generated, dummy mandrel patterns are generated in operation 23. The use of dummy mandrels in FinFET dummy areas, around FinFET boundaries, and in empty areas globally improves lithography control, particularly the CD control and the impact of line-end rounding and shortening of mandrel on device profile, and reduces loading effect processing issues, such as low mandrel density and non-uniformity causing different etch rates between dense and empty regions in subsequent operations. Dummy mandrels are inserted all around FinFET boundaries and globally in remaining empty spaces as long as no interference occurs with other features and no design rule is violated.

Figure 10:
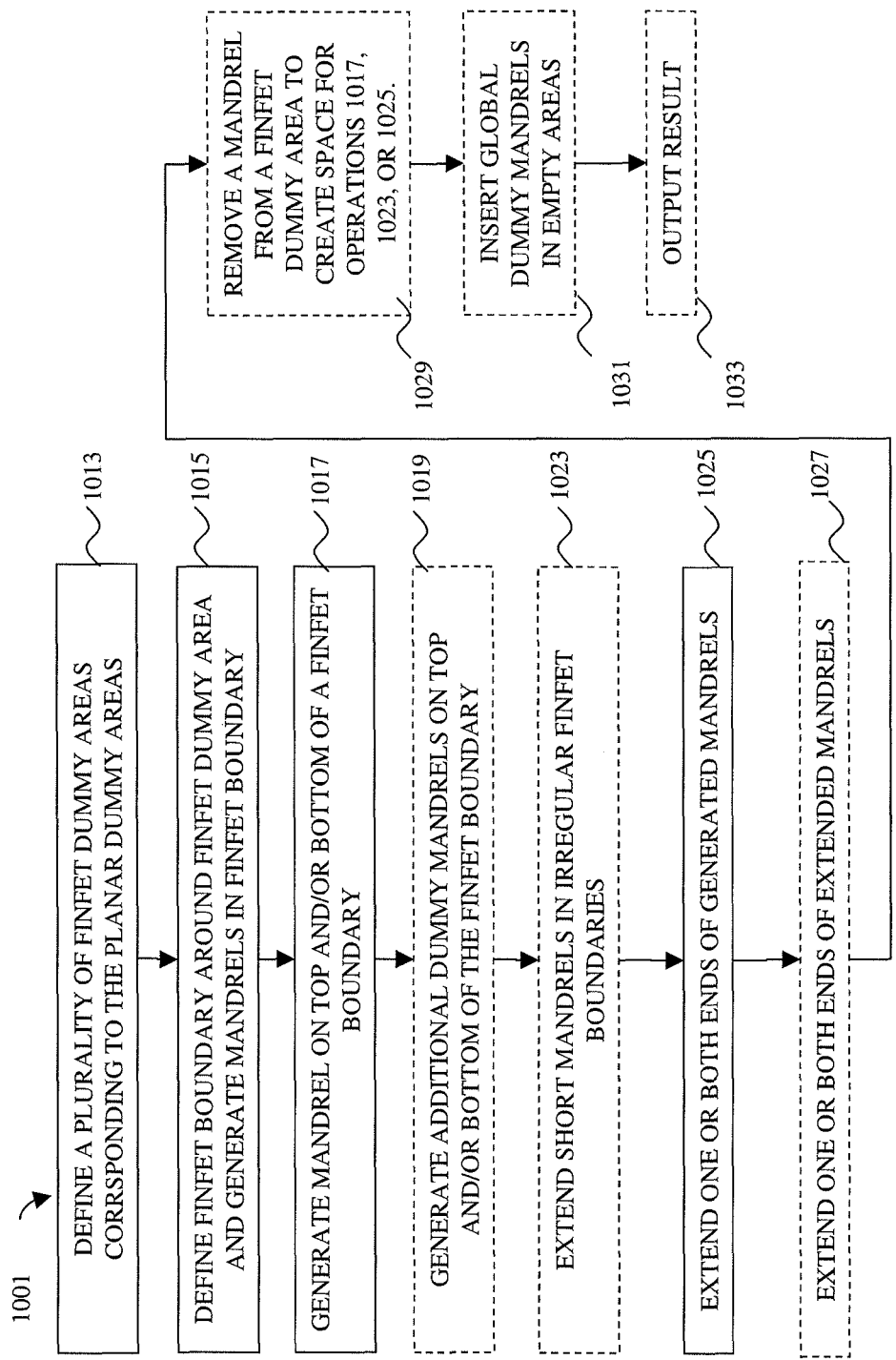
FIG. 10 illustrates a flowchart of a method for generating dummy mandrels around FinFET active areas, in FinFET dummy areas, and in global empty areas in accordance with various embodiments of the present disclosure.

FIG. 10 shows the dummy mandrel pattern generation method 1001 according to various embodiments of the present disclosure. In operation 1013, a plurality of FinFET dummy areas corresponding to planar dummy areas are defined. As discussed above, planar dummy areas along with planar active areas are provided in a planar structure layout. In operation 1015, FinFET boundaries are defined around FinFET dummy areas and mandrels are generated in those FinFET boundaries. Even though the FinFET dummy areas are not ultimately used in the IC design, dummy areas may nevertheless affect the electrical characteristics of the main device. The number of mandrels and location of mandrels in the FinFET dummy areas are less important than the other dummy mandrels. Generally, the mandrels are generated at a specific mandrel pitch that is the same as the mandrel pitch in the FinFET active areas.

In operation 1017, dummy mandrels are generated on top and/or bottom of each FinFET boundary. Dummy mandrels on top and/or bottom of a FinFET boundary improve the lithography control and etching operation for the FinFETs within the FinFET boundary. Due to the manufacturing process, the end, or router, mandrels of a FinFET boundary can have non-uniform width and may not be straight. By making the end mandrels into dummy mandrels, the uniformity and shape of the mandrels within the FinFET boundary are improved. One dummy mandrel is added to the top and/or bottom of the FinFET boundary on pitch if the spacing allows. The on-pitch dummy mandrel is spaced from the rest of the mandrels in the FinFET boundary the same distance as the other mandrels are spaced from each other.

At least a dummy mandrel insertion spacing between the end mandrel and an adjacent feature is required. The dummy mandrel insertion spacing is the minimum run-to-run space plus one mandrel pitch. The minimum run-to-run space is defined as the distance below which the manufacturing process cannot form adjacent feature sides. Other minimum spaces include minimum end-to-end space and minimum run-to-end. These minimum spaces are typically defined by the technology node and depend on the lithographic process used. An end-to end minimum space is the minimum distance between ends of adjacent features, such as the ends of two mandrels. A run-to-end minimum space is the minimum distance of a side and an end of adjacent features, such as a side of a mandrel in the vertical direction to an end of a mandrel in the horizontal direction.

If the distance between the end mandrel, either the top mandrel or the bottom mandrel, in a FinFET boundary and the adjacent feature is greater than the dummy mandrel insertion spacing, than at least one mandrel may be inserted in the space without violating the minimum run-to-run space.

After one iteration of dummy mandrel insertion for each FinFET boundary, then additional dummy mandrels on top and/or bottom of the FinFET boundary may be optionally generated in operation 1019. The benefit of having dummy mandrels decreases with additional dummy mandrels inserted. Thus, at least one iteration where every FinFET boundary is evaluated for dummy mandrel insertion occurs before additional dummy mandrels are inserted.

Figure 11:
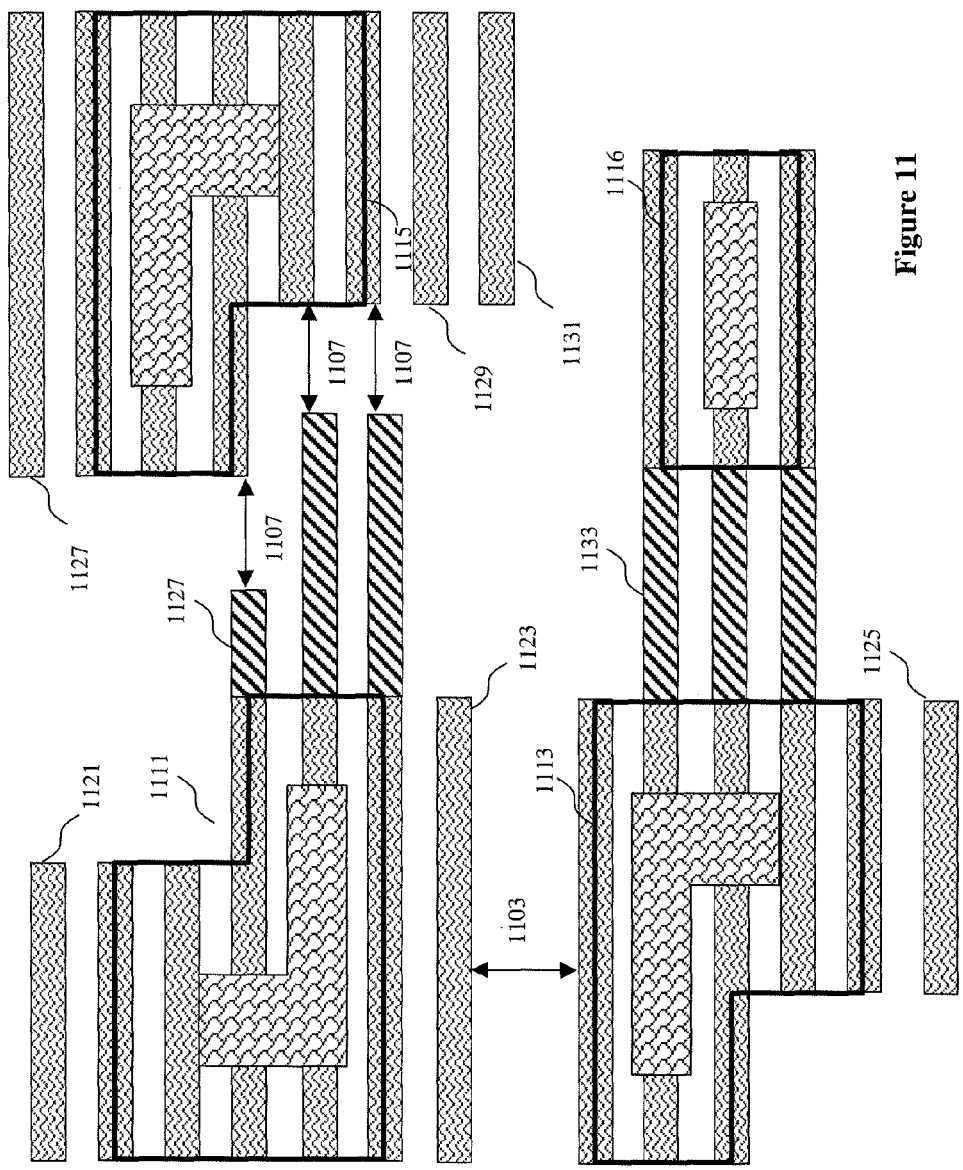
FIGS. 11-13 illustrate various examples of dummy mandrel generation according to various embodiments of the present disclosure.

FIG. 11 shows example FinFET boundaries in accordance with operations 1017 and 1019. FIG. 11 includes FinFET boundaries 1111, 1113, and 1115. In operation 1017, a dummy mandrel 1121 is generated at the top of FinFET boundary 1111, and another dummy mandrel 1123 is generated at the bottom of FinFET boundary 1111 because the distances between FinFET boundary 1111 and adjacent features are greater than the dummy mandrel insertion spacing. The pitch between dummy mandrels 1121 and 1123 and adjacent mandrels are the same as the pitch of mandrels within the FinFET boundary 1111. For FinFET boundary 1113, however, a top dummy mandrel cannot be inserted because the space 1103 between mandrels is less than the dummy mandrel insertion spacing. Thus, only a bottom dummy mandrel is inserted for FinFET boundary 1113. For FinFET boundary 1115, both top dummy mandrel 1127 and bottom dummy mandrel 1129 are inserted. In operation 1019, additional dummy mandrels are inserted if spacing is available. In the examples in FIG. 11, only FinFET boundary has available space at the bottom location, so dummy mandrel 1131 is generated.

In another example, the distance 1103 is greater than dummy mandrel insertion spacing. One dummy mandrel may be inserted in the space 1103. As shown in FIG. 11, FinFET boundary 1111 already has a bottom dummy mandrel and FinFET boundary 1113 does not have a top dummy mandrel. Inserting a dummy mandrel in space 1103 as the top dummy mandrel for 1113 would improve the mandrel uniformity and shape for mandrels within FinFET boundary 1113. Inserting a dummy mandrel in space 1103 as an additional bottom dummy mandrel for 1111 would also improve the mandrel uniformity and shape for mandrels within FinFET boundary 1111, but to a lesser extent than the improvement for 1113. Thus, in this example, a dummy top mandrel should be generated for FinFET boundary 1113 in the space 1103.

Referring back to FIG. 10, in operation 1023 short mandrels in non-rectangular FinFET boundaries are extended. Examples of non-rectangular FinFET boundaries include 1111, 1113, and 1115 of FIG. 11. Where space permits, the shorter mandrels in non-rectangular FinFET boundaries are extended.

Figure 12:
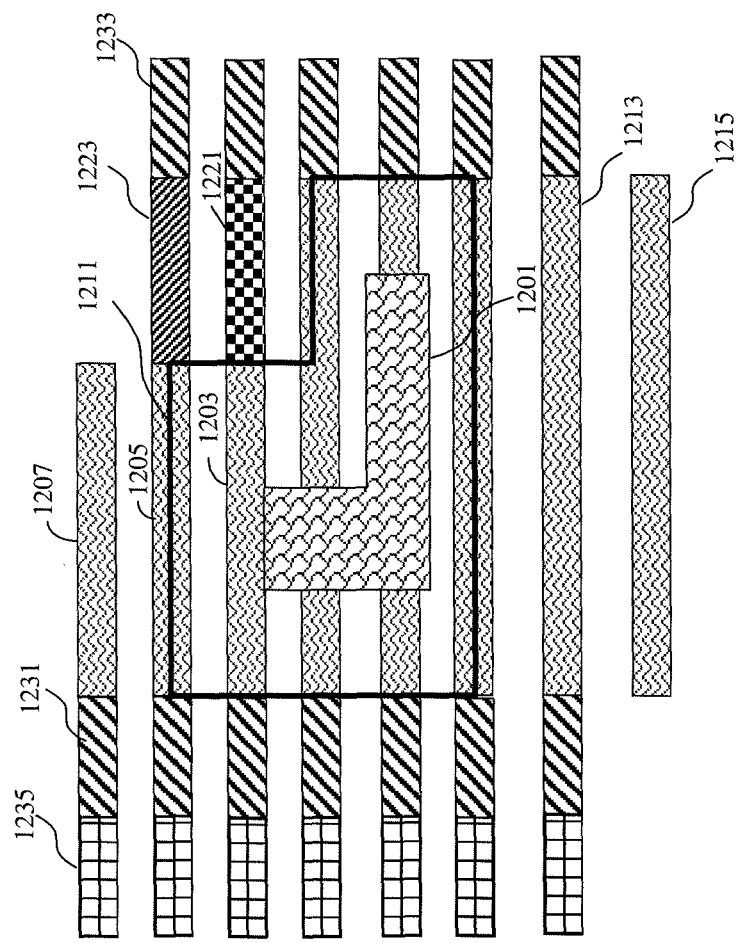

FIG. 12 illustrates an non-rectangular FinFET boundary 1211 where one or more short mandrels are extended in accordance with various embodiments of the present disclosure. The non-rectangular FinFET boundary 1211 includes an non-rectangular FinFET active area 1201 with a short edge and a long edge. The generated mandrels are short around the short edge of the FinFET active area 1201 and long around the long edge of the FinFET active area 1201. In at least one embodiment, the shorter mandrels around the short edge are extended to the same length as the long mandrels, as long as spacing constraints allow according to design rules. In this embodiment, extension mandrels 1221 and 1223 are added to the existing short mandrels to make them the same length as the rest of the mandrels.

In another embodiment, the short mandrels are extended one at a time. In this embodiment, the first short mandrel closest to the short edge of the FinFET active area 1201 is extended with extension 1221 first. Before the second short mandrel is extended with extension 1223, other dummy mandrel operations can occur first, such as adding dummy mandrels on top and/or bottom of nearby FinFET boundaries and a first side extension of the generated mandrels. Because the process improvement decreases with the dummy mandrel portion distance from the FinFET active area edge, the extension 1221 closest to the FinFET active area edge is generated first in this embodiment. Other dummy mandrel additions and extensions are generated before the second extension 1223 is added.

FIG. 12 also shows a top dummy mandrel 1203 and two bottom dummy mandrels 1205 and 1207. In some embodiments, as many top dummy mandrels and as many bottom dummy mandrels are added as space permits. In other embodiments, only one top dummy mandrel and one bottom dummy mandrel are added in a first iteration. After all other dummy mandrels and extensions have been made at least once, then a second top dummy mandrel and a second bottom dummy mandrel may be added.

Referring back to FIG. 10, in operation 1025, one or both ends of generated mandrels are extended. Generally, the fin ends, as the mandrel ends, have slightly different width as the middle portion of the fins and mandrels. A small width difference in a mandrel would result in a pair of non-parallel fins, which would then cause unknown variations in the electrical properties such as line-end rounding and shorting of mandrel.

Even though mandrels are generated for a length longer than the FinFET boundary to ensure a process buffer, extending the mandrels ends further improves process control by ensuring that the length of the fins in the FinFET active area would have the same width. As with other types of dummy mandrel, the first extension would achieve the most process improvement, with diminishing results for subsequent extensions. In operation 1025, one or both ends of the generated mandrels are extended as far as spacing permits. In other embodiments, the one or both ends of the generated mandrels are extended first by a specified extension length. In a second iteration, the generated mandrels are further extended as far as spacing permits.

If a space between the FinFET boundary and an adjacent feature is greater than a dummy mandrel extension spacing, then the extension may be added to that side of the FinFET boundary. The dummy mandrel extension spacing is the minimum space between the mandrel ends and an adjacent feature, usually the end-to-end minimum space. The mandrels are extended as long as possible until the end-to-end space between two misaligned mandrels equal to the minimum end-to-end space. In some cases the two adjacent mandrels are aligned, then the dummy mandrels may be extended to connect these two mandrels. The difference between misalignment and alignment may be specified by the IC designer. For example, two mandrels may be determined to be aligned if the offset between them is less than 10 nms, or less than 5 nms. The alignment may also be determined based on a percentage of the mandrel pitch, for example, less than 20% or less than 10% offset of the mandrel pitch may be aligned.

In some embodiments, the mandrels are extended first by a specified extension length. If the space were greater than the dummy mandrel extension and the minimum space, then adding one extension would result in a space between the mandrel ends and the adjacent feature that is greater than the minimum space. If the space were less than the dummy mandrel extension spacing, then adding one extension would result in a minimum space violation because the resulting space would be less than the minimum space—in these cases the mandrels are extended until the remaining space is the minimum space. The operation 1025 may occur before or after extending the short mandrels of operation 1023.

Both FIGS. 11 and 12 include examples demonstrating the extension concept in accordance with various embodiments of the present disclosure. In FIG. 11, extension mandrels 1127 are added to the mandrels of FinFET boundary 1111 on one side only. The mandrels of FinFET active areas 1111 and 1115 are not aligned. The distance 1107 between the end of the extension 1127 and the mandrels of FinFET boundary 1115 is at a minimum space requirement. Note that FIG. 11 does not include an extension on the dummy mandrel 1123. In some embodiments, the dummy mandrel 1123 may be added after the extensions 1127. In other embodiments, the extensions are not added to pre-existing dummy mandrels. In still other embodiments, the extensions are added to all mandrels associated with the same FinFET boundary, including dummy mandrels as long as space permits. In these embodiments extension 1127 would be added to dummy mandrel 1123.

FIG. 11 also shows an embodiment where the mandrels from different FinFET active areas are aligned. FinFET active areas 1113 and 1116 have mandrels that are aligned. So the mandrels are extended until the mandrels are connected, as shown with extension 1133.

FIG. 12 shows the first mandrel extensions 1231 and 1233 on either side of the FinFET boundary 1211. FIG. 12 shows an embodiment where discrete extension lengths are first used to extend the mandrels. One extension length is added to mandrels on both ends of the mandrels for FinFET boundary 1211. Note that the short mandrel extensions 1221 and 1223 are both extended also. In some embodiments, the mandrel extensions are generated after the short mandrels are extended, so the extended short mandrels are also extended, as long as spacing permits. Note however, the second bottom dummy mandrel 1215 is not shown as extended. In one example, the second bottom dummy mandrel 1215 is added after the first mandrel extension of 1231 and 1233. In that case, the additional dummy mandrel 1215 may be made the extended length, length of 1231, 1213, and 1233, or be made the original length, length of 1213 only. In another example, the second bottom dummy mandrel 1215 is added before the extension of 1231 and 1233; however, extensions are not added to dummy mandrel 1215 because spacing does not permit it.

Referring back to FIG. 10, in optional operation 1027, one or both ends of extended mandrels may be extended again. In the embodiments where extensions are made in specified extension lengths, a second iteration further extends the mandrels after the first extensions are made. This is shown in FIG. 12. A second extension 1235 is added to the extension portion 1231 of mandrels associated with FinFET boundary 1211. This second extension may be added if the space between an end of the extended mandrel and an adjacent feature is greater than the dummy mandrel extension spacing. In other words, additional extensions may occur until the space between an end of the mandrel extension and an adjacent feature reaches a minimum end-to-end space. In some embodiments, the spacing requirement is satisfied for one end of the mandrels but not the other end, so only the end with the space has extensions added. In certain embodiments, the space is only available for some of the mandrels but not all. In these cases the extension may be added only for those mandrels with the space or for none of the mandrels because not all of them have enough space.

Figure 13:
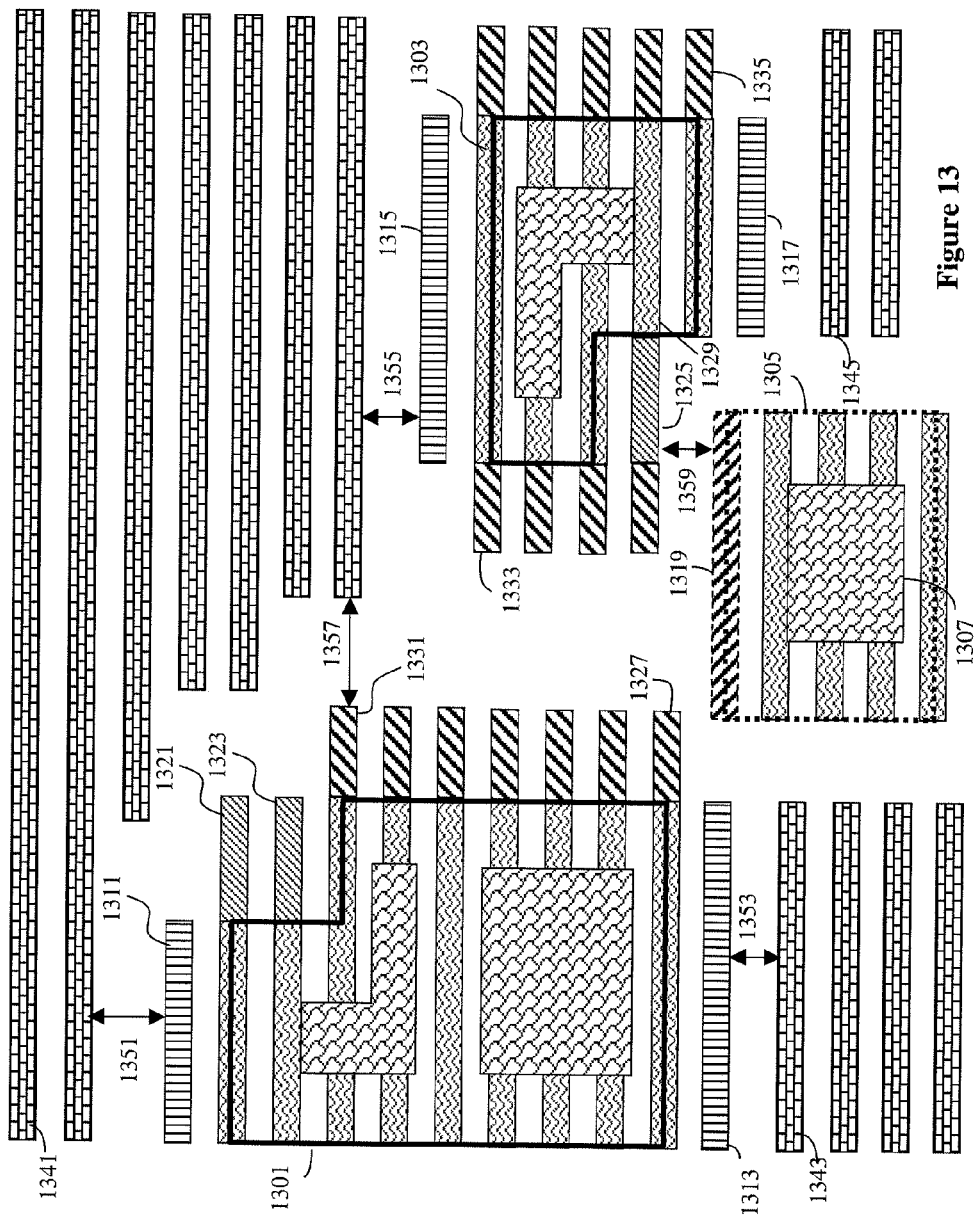

Referring back to FIG. 10, in optional operation 1029 a mandrel may be removed from a FinFET dummy area to create space for a top or bottom dummy mandrel of operation 1017, extension of short mandrels of operation 1023, or extension of mandrel ends of operation 1025. An IC designer may determine an order of priority for each types of dummy mandrels for insertion and/or removal. Generally, a mandrel within a dummy area may have priority over a mandrel extension. In some cases, a top or bottom dummy mandrel may have priority over a mandrel in a dummy area. As discussed, FinFET dummy areas are inserted to correspond to planar dummy areas. No active device is to be formed in these areas. However removing one or more mandrels from a dummy area to make room for other dummy mandrels must be weighed carefully because changing the pattern in a dummy area may have other effects. FIG. 13 includes an example illustration.

FIG. 13 is a partial layout including FinFET boundaries 1301, 1303, and 1305. FinFET boundary 1305 includes a FinFET dummy area 1307. As shown, FinFET boundary 1305 is generated with 5 mandrels including mandrel 1319. In certain embodiments, mandrel 1319 is removed to make space for mandrel extension 1327 so that mandrels of 1301 are extended at one end by a specified extension length, and short mandrel 1329 of FinFET boundary 1303 is extended by a mandrel extension 1325. Without removing the mandrel 1319, the mandrel extension 1327 cannot be added because the space between the mandrel extension 1327 and the mandrel 1319 would have been less than the minimum space. Similarly, the space 1359 between mandrel 1319 and mandrel extension 1325 is less than the minimum space. Removing mandrel 1319 allows additional dummy extensions to be generated where the presence of the dummy extensions has a higher likelihood of improving the process result. In other embodiments, the dummy mandrel 1319 is not removed and the dummy mandrel 1327 is not added.

Referring back to FIG. 10, in operation 1031 global dummy mandrels are inserted in empty areas. Global dummy mandrels are not associated with any FinFET boundary, but rather follow a global mandrel pitch in contiguous pieces. The spacing between global dummy mandrels and surrounding features follow the same design rules for minimum spacing. Global dummy mandrels are generated in any length or in discrete lengths. The global dummy mandrels are generated in all empty areas to fill up an entire layout until further additions would violate a minimum space requirement. Generally, global dummy mandrels are parallel to the mandrels to which they surround. However, global dummy mandrels may be horizontal or vertical, in other words, parallel or perpendicular to the bulk of the mandrels, or a combination of both. Similarly to the mandrel extensions, if the global dummy mandrels are aligned with the mandrels within a FinFET active area, the global dummy mandrels may be formed connected to the mandrels within a FinFET active area. If the global dummy mandrels are not aligned with the mandrels within a FinFET active area, then an appropriate minimum space must be maintained.

FIG. 13 shows three distinct areas of global dummy mandrels. The top area includes 7 mandrels of 4 different lengths. The mandrels are generated to be as long as possible without violating minimum spacing rules. However, a minimum mandrel length is required for the global dummy mandrels because of process limitations. In at least one embodiment, all global dummy mandrels are placed within the available space, and then all dummy mandrels that are too short are removed. Global dummy mandrels may also be removed from "forbidden areas" of the device, for example, from the seal ring area and periphery areas. In other embodiments, global dummy mandrels are only placed if enough room exists for a mandrel length that is greater than a minimum mandrel length to meet process limitations. Thus, spaces 1351 and 1355 are greater than the run-to-run minimum space and less than the dummy mandrel insertion spacing, and space 1357 is greater than the end-to-end minimum space and less than the dummy mandrel extension spacing.

Similarly, the lower right area of global dummy mandrels is generated on-pitch from each other. Spacing 1353 separates dummy mandrel 1313 from global dummy mandrel 1343 and is greater than or equal to the run-to-run minimum space and less than the dummy mandrel insertion spacing. The third area of global dummy mandrels includes two mandrels and fills the remainder of the empty space in FIG. 13.

FIG. 13 is an example result of various dummy mandrel operations for a layout portion in accordance with various embodiments of the present disclosure. The layout portion of FIG. 13 includes a FinFET boundary 1301 comprising two FinFET active areas. One FinFET active area is an non-rectangular shape and the other FinFET active area is rectangular. These two FinFET active areas are in the same FinFET boundary 1301 because they are too close to have separately generated mandrels. FinFET boundary 1303 includes one non-rectangular shape FinFET active area. FinFET boundary 1305 encloses a FinFET dummy area 1307.

As an example of the method 1001 of FIG. 10, the various operations are applied to the FinFET boundaries of FIG. 13. In operation 1013 the FinFET dummy area 1307 is defined. In operation 1015 the FinFET boundary 1305 is defined and 5 mandrels including mandrel 1319 is generated. In operation 1017, one mandrel is generated on top and/or bottom of a FinFET boundary if the space between the end mandrel (the very top mandrel or the very bottom mandrel) and an adjacent feature is greater than dummy mandrel insertion spacing. In operation 1017, for FinFET boundary 1301, one dummy mandrel 1311 is inserted on top and one dummy mandrel 1313 is inserted on bottom. For FinFET boundary 1303, a top dummy mandrel 1315 and a bottom dummy mandrel 1317 are inserted. Note that the inserted dummy mandrels have the same length as the nearest mandrels within the FinFET boundaries. No dummy mandrels are inserted in FinFET boundary 1305 because it encloses a FinFET dummy area 1307. In the example of FIG. 13, optional operation 1019 is not performed. In operation 1023, short mandrels of FinFET boundary 1301 are extended by adding extensions 1323 and 1321. For FinFET boundary 1303, the short mandrels are not extended because of the spacing between the extensions in mandrel 1319 in FinFET boundary 1305.

In operation 1025 as applied to FIG. 13, mandrel extensions including 1331 and 1327 are generated at one end of the mandrels of FinFET boundary 1301. Mandrel extensions for operation 1025 may or may not apply to short mandrels that are extended in operation 1023. In the example of FinFET boundary 1301, mandrel extensions are not generated on extensions 1323 and 1321. However, for FinFET boundary 1303, mandrel extensions including 1333 are generated on one end of the mandrels, including the extended portion 1325 for the first short mandrel 1329. Mandrel extensions including 1335 are generated on the other end of the mandrels, including both of the short mandrels. Note that the second short mandrel is not extended on the left because of the proximity of the second short mandrel to the second mandrel of FinFET boundary 1305 and possibly to the FinFET dummy area 1307. Note also that mandrels associated with FinFET dummy areas, such as those of FinFET boundary 1305, are not extended in operation 1025. The mandrels extensions do not connect the mandrels from FinFET active areas 1301 and 1303 because the mandrels are not aligned.

In optional operation 1027, the mandrel extensions may be increased by a specified extension length if space permits. In the example of FIG. 13 an additional specified extension length on extensions 1331 or extensions 1333 would render the remaining space less than the minimum space. In other words, the horizontal distance between the closest ends of extensions 1331 and 1333 are less than dummy mandrel extension spacing, so no additional extensions are generated. In some embodiments, additional extensions may be generated until the horizontal distance between the closet ends of extensions 1331 and 1333 reach the minimum space. Operation 1029 was discussed in association with operation 1023. Many of these operations 1013 and 1029 may be performed in orders other than depicted in FIG. 10. However, operation 1031 is performed after all dummy mandrels and extensions that are associated with FinFET boundaries are inserted. In operation 1031, global dummy mandrels are inserted in all remaining empty space in a layout. In FIG. 13, three areas of global dummy mandrels are inserted, a top area starting with mandrel 1341, a bottom left area starting with mandrel 1343, and a lower right area starting with mandrel 1345.

Referring back to FIG. 10, in operation 1033 the result of the layout may be outputted. The layout may be outputted in various machine-readable forms from which a photomask may be manufactured. Commonly used formats include Graphic Data System II (GDSII) and OASIS. The layout may also be outputted for further modification to make the layout manufacturable by adding other features or for design rule checking (DRC) and verification. Commonly used DRC software includes Calibre by Mentor Graphics; Hercules by Synopsys; Diva, Dracula, Assura, and PVS by Cadence Design Systems.

In various embodiments, a new metal layer may be generated as shown in operation 25 of FIG. 1A when the planar contact is outside of the FinFET portion or does not adequately contact or landing in the FinFET portion. As discussed, FinFET active areas may be larger, smaller than, or equal to the planar active area, depending on results of the width optimization. When a FinFET active area is smaller than the corresponding the planar active area, the planar contact may be located outside of the FinFET active area or the planar contact may not have enough landing area within the FinFET active area.

One way to resolve the contact landing issue is to relocate the contacts; however, such relocation would involve changes to subsequent metal layers, for example, the M1 metal layer where the interconnect routing would correspondingly change. Further, changes to the M1 layer may also cause changes in other layers, for example, the via layer above the M1 metal layer. As discussed, changes to existing photomasks, in other words, layout of layers above the transistor level are to be avoided because they can dramatically increase manufacturing cost in addition to extra time and effort for redesigning these layers.

According to various embodiments of the present disclosure, a new metal layer, M0, is generated to resolve the contact landing issue. The M0 metal layer connects the source or drain region of a FinFET to the contact from the planar layout. The M0 metal layer is in the same layer, or the same distance from the substrate, as the transistor gates. The planar contacts from the planar layout would be formed in a layer directly over the M0 metal layer. FIG. 14B illustrates these layers and the new metal layer, M0, in a cross section of one FinFET active area. A source region and a drain region (1433 and 1435) are formed in a substrate 1431 along with a gate oxide 1437 and gate1439 in an active region layer 1451. The gate structure may be one of the known types including a polysilicon gate or a high-k metal gate. Spacers 1441 are deposited around the gate stack including oxide 1437 and gate material 1439. The M0 metal lines 1443 are in the same layer 1453 as the gate stack (1437 and 1439). Above the M0 metal layer and the gate structure is the contact layer 1455, which includes a contact 1447 connecting the gate to metal feature 1449 above and a contact 1445 connecting a M0 metal line 1443 to metal feature 1459 above. The metal features 1449 and 1459 are in the M1 metal layer 1457.

Figure 14A:
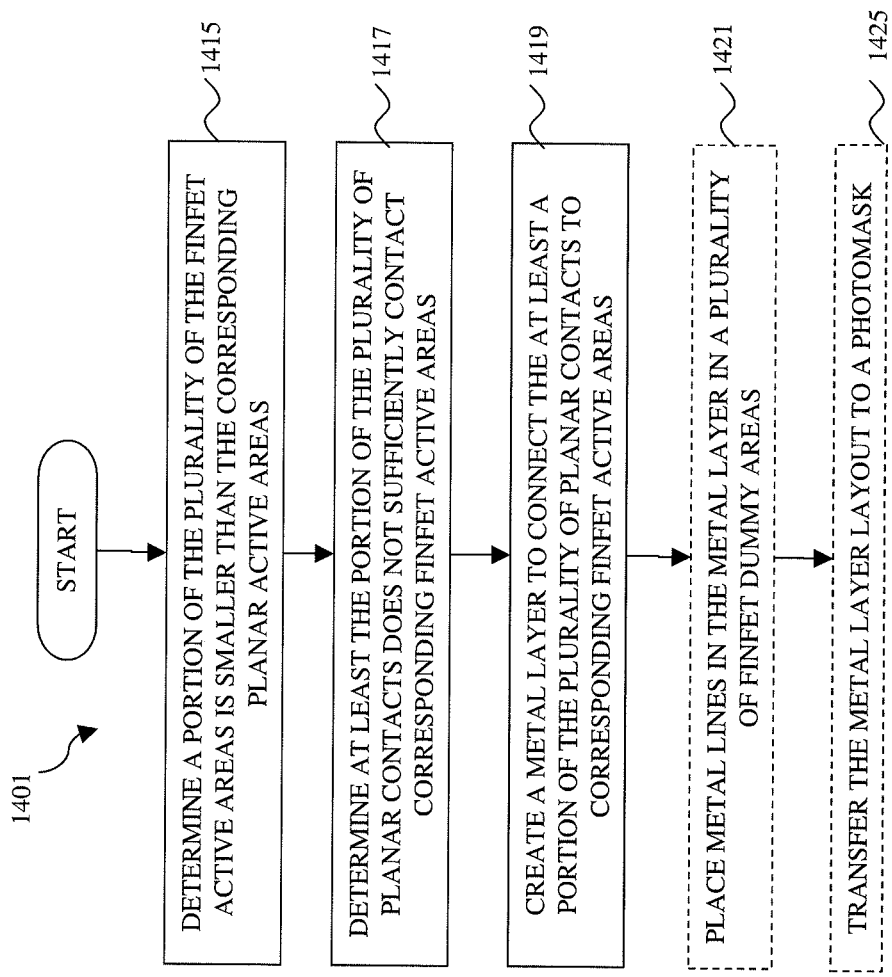
FIG. 14A illustrates a flowchart of a method for creating a metal layer in a FinFET structure layout in accordance with various embodiments of the present disclosure.
Figure 14B:
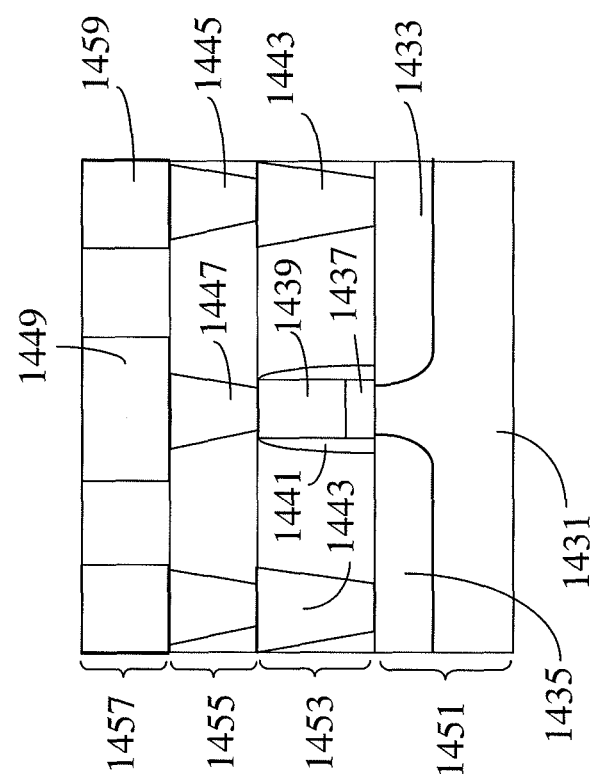
FIG. 14B illustrates a cross-section view of IC design layers including a M0 metal layer in accordance with various embodiments of the present disclosure.

FIG. 14A illustrates method 1401 for forming the M0 metal layer in accordance with various embodiments of the present disclosure. Definition of FinFET active areas corresponding to planar active areas from operation 17 of FIG. 1A, matching operation and width and beta ratio optimizing are used in operation 1415 to determine whether at least one, or some of the FinFET active areas are smaller than the corresponding planar active areas. If the FinFET active area is larger than the planar active area, the contacts would land in the FinFET active area the same way as they would in the planar active area. Thus the M0 metal layer addresses the landing issues in those cases where the FinFET active areas are smaller than the corresponding planar active areas. However, if the M0 metal layer is used, for process and SPICE model considerations, the M0 metal layer may be used for all contacts in source/drain regions for all FinFETs in the layout.

Figure 15:
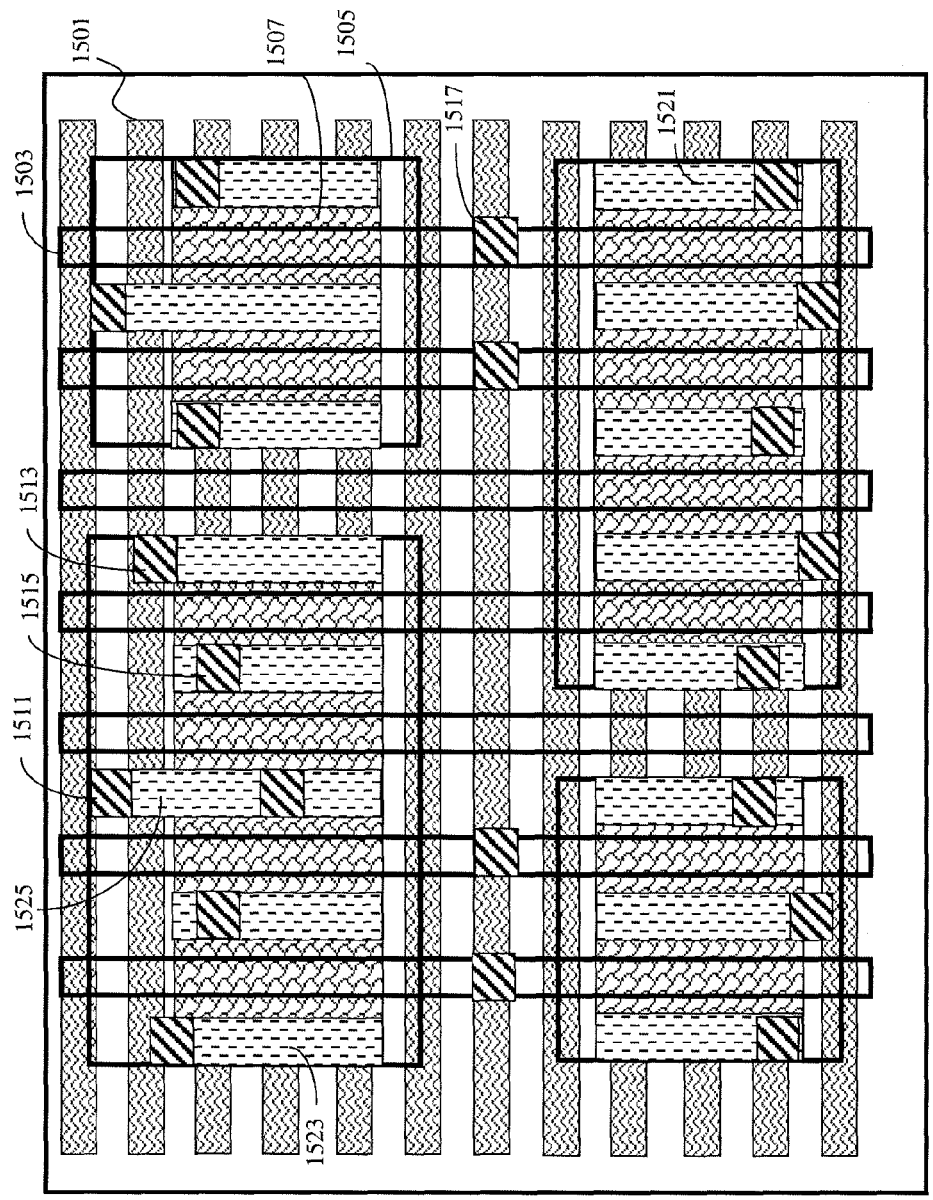
FIGS. 15-16 illustrate various examples of metal lines for the metal layer according to various embodiments of the present disclosure.

In operation 1417, a further determination is made whether at least some of the plurality of planar contacts does not sufficiently contact corresponding FinFET active areas. Just because the FinFET active areas are smaller does not necessarily mean that the contacts would be outside of the FinFET active areas. Generally a contact may land anywhere within the source or drain region of a transistor. The un-landing issue occurs when the contact lands off to one edge for the planar active areas. The un-landing may also be an issue when the contacts lands right on the edge of the FinFET when the process margin, the design rule, full enclosure of contact with in a FinFET boundary are taken into consideration. FIG. 15 illustrates some of these contact-unlanding issues in accordance with various embodiments of the present disclosure. Design rules may limit how the M0 lines relate to each other in terms of minimum spacing with each other and other features. For example, a minimum spacing between the M0 metal lines from end-to-end may be specified. These minimum spacings (end-to-end, end-to-run, and run-to-run) may be the same as those of other features, such as mandrels.

FIG. 15 shows a number of mandrels 1501 spaced apart equally according to a mandrel pitch. Four FinFET active areas 1507 and corresponding planar active areas 1505 are shown. The transistor gates 1503 are also shown on the layout, some of them having a contact 1517 thereon. FIG. 15 includes various contacts 1511, 1515, and 1513. All of the contacts are located entirely within the corresponding planar active area; however, some of them, such as contact 1511, are located entirely outside of the FinFET active area; some others, such as contact 1513, are located partially in the FinFET active area; and still others, such as contact 1515, are located entirely within the FinFET active area.

Depending on where the contact lands relative to the FinFET active area, a metal layer to connect the contacts to corresponding FinFET active areas is created in operation 1419 of FIG. 14A. Certain examples of the metal layer are illustrated in FIG. 15. For contacts that land entirely outside of the FinFET active area, metal lines such as 1525 are used to connect the contact 1511 with the source/drain region of the FinFET active area. For contacts that land partially outside of the FinFET active area, metal lines such as 1523 are used to ensure a good connection between the contact and the corresponding region of the FinFET active area. For contacts that land entirely inside of the FinFET active area, metal lines such as 1521 may or may not be used to increase the conductive contact area.

The various metal lines of FIG. 15 are parallel with the gate structures both in an overview and in cross-section. In other words, the metal lines for the M0 metal layer is the same distance away from the substrate as the transistor gates, as shown in FIG. 14B. Both the metal lines are the transistor gates are parallel to the substrate over the fins. Thus, no additional layer of material is added to the integrated circuit device.

Figure 16:
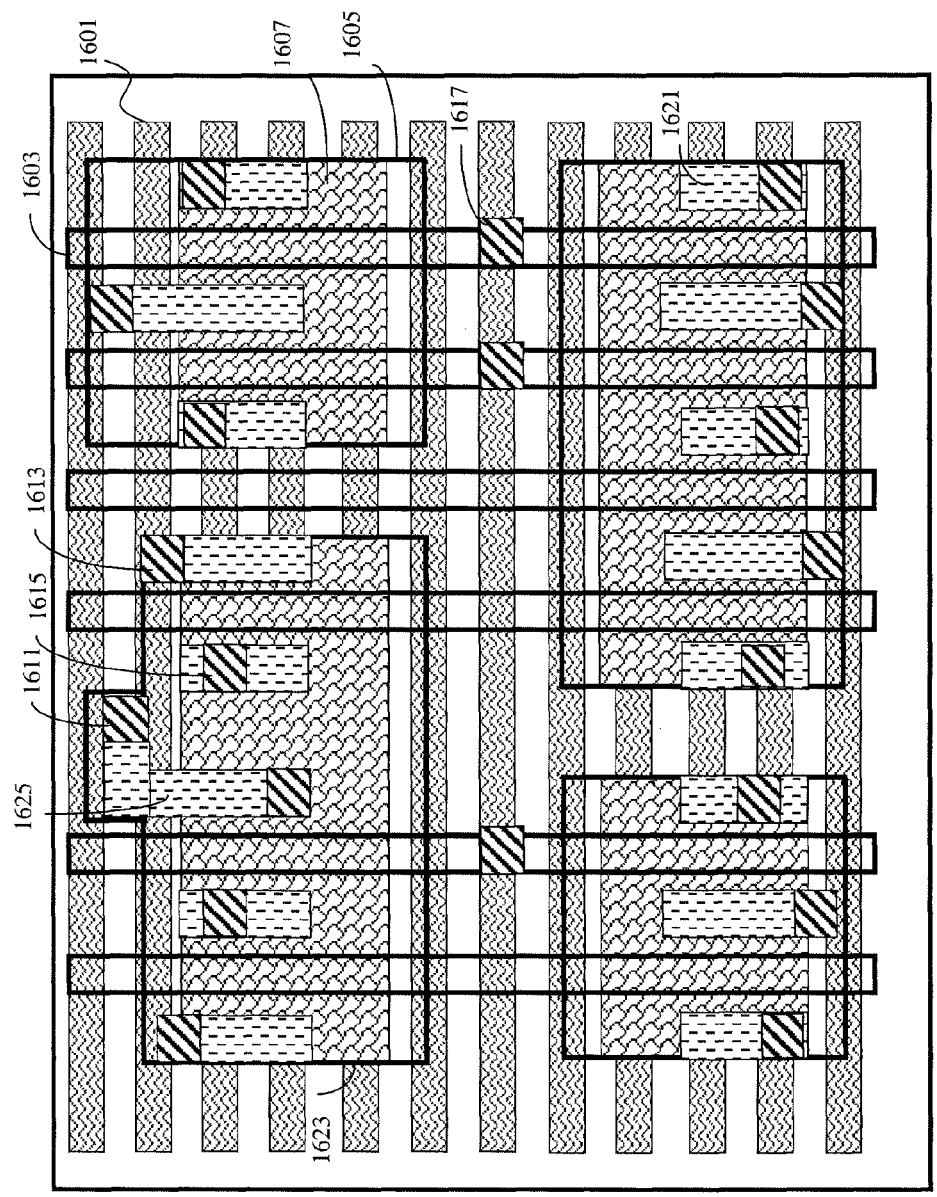

FIG. 16 shows another example of a metal layer in accordance with various embodiments of the present disclosure. Some metal lines in FIG. 16 have portions that are perpendicular, such as metal line 1625, with a portion of the metal line in the FinFET channel direction and a portion of the metal line in the FinFET channel width direction. Metal line 1625 connects contact 1611 with a portion of the FinFET active area. The planar active area 1623 includes a T-shaped extrusion where contact 1611 is located. Note that the layout of FIG. 16 has one less transistor gate patterned than that of FIG. 15. The metal contact 1611 cannot be formed with the transistor gate in place because the metal line and the transistor gates are co-planar. Metal lines having perpendicular portions such as 1611 may be located in various places in the metal layout when a contact cannot be directly connected with a metal line parallel to the transistor gates.

In both FIGS. 15 and 16, metal lines may be formed to increase contact area even if the contact is located directly over portions of the FinFET. Forming these metal lines has the additional benefit of increasing metal line pattern density and can increase uniformity of all of the metal lines in the M0 metal layout. Further, the M0 metal layer may have a specific set of design rules to follow for process considerations. For example, the M0 metal lines may have specified a minimum end-to-end space, run-to-run space, length, width, minimum space to gate contact, and minimum space to gate structures.

Referring back to FIG. 14A, in operation 1421 metal lines may be placed in the metal layer in a plurality of FinFET dummy areas. While FinFET dummy areas do not form transistors that are used in the integrated circuit, having metal lines in the FinFET dummy areas, or dummy metal lines, can improve process uniformity by increasing pattern density of these metal lines in the M0 metal layer.

In operation 1425, the metal layer layout may be transferred to a photomask for forming a pattern on the wafer. This photomask is new relative to the planar IC design. In other words, in order not to change photomasks for other layers by moving the contacts, a new photomask is created. The metal layer may be formed before or after the gates are formed.

Referring back to FIG. 1A, note that the operations 23 and 25 may be performed at the same time or at different times. While optimized FinFET active areas are used in the metal layer generation in operation 25, dummy patterns of operation 23 are not. Thus, the dummy patterns of operation 23 and metal layer of operation 25 may be generated independent of each other. In certain instances, the metal layer may not be required, if all of the planar contacts are located within FinFET active areas. Finally, the FinFET structure layout is outputted in operation 27. Outputting of the layout may include various verification operation such as a design rule check, layout versus schematic (LVS) check, pattern quality check, and even an eyeball check. During the design rule check, all of the layouts are checked against design rules for manufacturability. Any remaining violations are highlighted and may be fixed by a separate process.

In the LVS check, a netlist is created from the FinFET layout and checked against a netlist created from the planar layout. A FinFET netlist based on original planar netlist and FinFET layout will be generated automatically for designer to do the SPICE simulation. The designer may want to modify the fin number of some device for better performance or power reduction after the SPICE simulation. Layer consistency is ensured by making sure no information in lost in the planar transistor to FinFET conversion—no loss of layers or data types). Additionally, the LVS check ensures that there are no unintended shorts, opens, and mismatches of components (devices) or parameters. In the pattern quality check, the pattern is analyzed for potential lithographical patterning hot spots due to process variations. These hot spots are flagged for review in the eyeball check where an IC designer reviews the layout one last time.

The layouts are outputted in one of the commonly used formats for IC layout including GDS II stream format (graphical data system) or OASIS (Open Artwork System Interchange Standard). Outputting of an IC layout is commonly referred to as tape-out. The output may be reviewed by an original IC designer before manufacturing starts.

Figure 17:
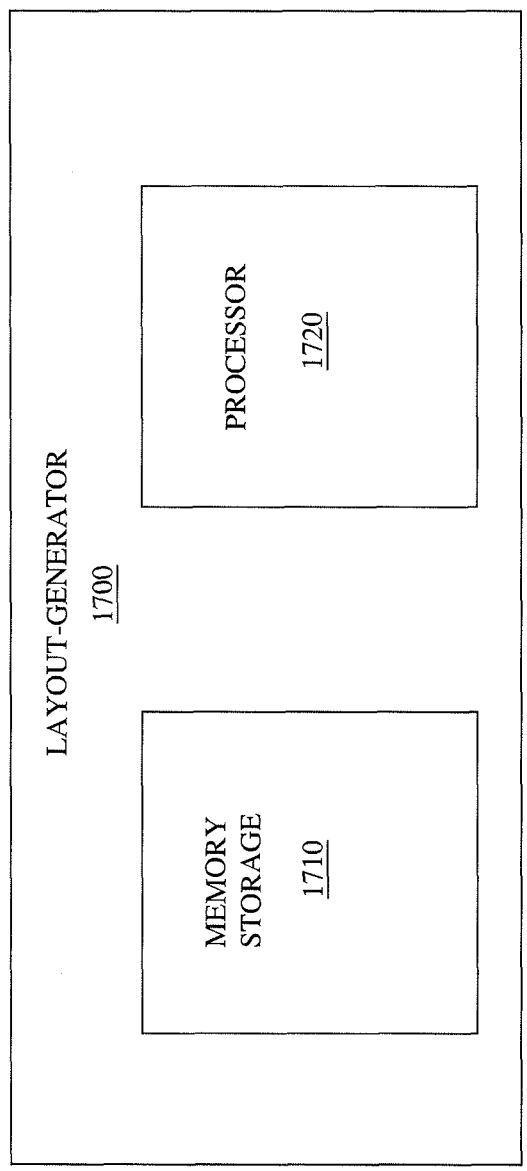
FIG. 17 is a simplified diagrammatic view of a machine that can be used to generate the layout in accordance with aspects of the present disclosure.

The various operations of FIG. 1A in the planar layout to FinFET layout conversion process may be performed by a specialized layout generator. FIG. 17 is a simplified diagrammatic view of a layout-generator 1700 (or layout-generating machine). The layout-generator 1700 includes a machine or tool that can be used to perform the layout conversion process discussed above in association with various figures. In an embodiment, the layout-generator 1700 includes a memory storage component 1710 and a processor component 1720. The memory storage component 1710 is a non-transitory, tangible computer readable storage medium. For example, the computer readable storage medium may include a hard drive or a CD-ROM. The computer readable storage medium may be implemented as part of a single workstation or may be implemented as part of a centralized server.

The computer readable storage medium stores instructions that can be executed by the processor component 1720. These instructions contain algorithms used to carry out the various steps of converting an initial layout having planar devices to a layout having FinFET devices, as discussed above. In one embodiment, the instructions contain these following algorithms that may each be implemented as part of a computer program. One such algorithm is implemented to carry out defining a plurality of FinFET active areas corresponding to planar active areas from the planar structure layout. Another algorithm is implemented to carry out determining whether a FinFET cell is symmetrical. Yet another algorithm is implemented to carry out to generate mandrels from a mandrel generation point for a particular FinFET boundary. One more algorithm is implemented to carry out optimizing width and beta ratios for generated FinFET active areas.

The instructions containing these algorithms are fetched from the computer readable storage medium to the processor component 1720 for execution. After execution, the processor component 1720 generates a new layout having FinFETs. In other words, the planar devices from the initial layout are converted into the FinFETs in the new layout through the execution of the instructions containing the above-mentioned algorithms. The new layout having FinFETs may be stored in the memory storage component 1710. It is understood that additional algorithms may be included in the instructions as part of this layout conversion process. These additional algorithms correspond to the various methods described above. It is also understood that the new layout having FinFET devices may be sent to a photomask fabricator so that photomasks corresponding to the new layout may be produced.

The embodiments of the present disclosure discussed herein offer several advantages, it being understood that other embodiments may offer different advantages, and that no particular advantage is required for any embodiment. For example, any given layout (such as a planar device layout) can be automatically converted into a FinFET structure layout using the methods discussed herein. The entity (e.g. a design house) that generates the initial layout need not have the necessary tools to perform a FinFET layout and need not worry about meeting FinFET design rules. The entity (e.g. a foundry) that performs the above-described layout conversion will take care of the layout conversion from planar devices to FinFET devices in a seamless fashion. This enables the entity that generates the initial layout to have greater flexibility in performing the initial layout. In still other embodiments, various methods and tools discussed herein may be used by an entity that generates the initial planar layout to convert the planar layout to a FinFET layout.

According to some embodiments, a method for generating a FinFET structure layout is performed by a layout generating machine having a processor component executing instructions. The method includes receiving a planar structure layout for an integrated circuit (IC) design, the planar structure layout including a plurality of planar active areas; generating a plurality of FinFET active areas corresponding to the plurality of planar active areas; generating mandrels in a FinFET active area of the plurality of FinFET active areas according to a FinFET active area width; determining a beta number for the FinFET active area and a beta number for a corresponding planar active area; and adjusting the mandrels in the FinFET active area such that a beta ratio of the FinFET active area beta number to the planar active area beta number is within a predetermined beta ratio range.

According to some embodiments, a layout generating machine for generating a FinFET structure layout has a memory component storing instructions and a processor component executing the instructions. The instructions are configured to cause the layout generating machine to receive a planar structure layout for an integrated circuit (IC) design, the planar structure layout including a plurality of planar active areas; generate a plurality of FinFET active areas corresponding to the plurality of planar active areas; generate mandrels in a FinFET active area of the plurality of FinFET active areas according to a FinFET active area width; determine a beta number for the FinFET active area and a beta number for a corresponding planar active area; and adjust the mandrels in the FinFET active area such that a beta ratio of the FinFET active area beta number to the planar active area beta number is within a predetermined beta ratio range.

According to some embodiments, a layout generating machine for generating a FinFET structure layout has a memory component storing instructions and a processor component executing the instructions. The instruction are configured to cause the layout generating machine to receive a planar structure layout for an integrated circuit (IC) design, the planar structure layout including a plurality of planar active areas; generate a plurality of FinFET active areas corresponding to the plurality of planar active areas; for a FinFET active area of the plurality of FinFET active areas, calculate a modified FinFET active area width using a specified width ratio of FinFET active area width to planar active area width; and generate mandrels in the FinFET active area according to the modified FinFET active area width.

Although the embodiments and its advantages have been described in detail, it should be understood that various changes, substitutions and alterations could be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of generating a FinFET structure layout performed by a layout generating machine having a processor component executing instructions, the method comprising:
   receiving a planar structure layout for an integrated circuit (IC) design, the planar structure layout including a plurality of planar active areas;
   generating a plurality of FinFET active areas corresponding to the plurality of planar active areas;
   generating mandrels in a FinFET active area of the plurality of FinFET active areas according to a FinFET active area width;
   determining a beta number for the FinFET active area of the plurality of FinFET active areas;
   determining a beta number for a planar active area of the plurality of planar active areas corresponding to the FinFET active area of the plurality of FinFET active areas; and
   adjusting the mandrels in the FinFET active area of the plurality of FinFET active areas such that a beta ratio of the FinFET active area beta number to the planar active area beta number is within a predetermined beta ratio range.

2. The method of claim 1, wherein the predetermined beta ratio range is from about 0.85 to about 1.15.

3. The method of claim 1, wherein adjusting the mandrels in the FinFET active area of the plurality of FinFET active areas comprises one or more of extending a FinFET active area edge or shifting a mandrel generation point.

4. The method of claim 1, wherein adjusting the mandrels in the FinFET active area of the plurality of FinFET active areas comprises increasing the beta ratio by at least one of adding a fin to a p-type FinFET or removing a fin from an n-type FinFET.

5. The method of claim 1, wherein adjusting the mandrels in the FinFET active area of the plurality of FinFET active areas comprises decreasing the beta ratio by one or both of adding one or more fins to an n-type FinFET or removing one or more fins from a p-type FinFET.

6. The method of claim 1, wherein the predetermined beta ratio range is based on a type of cell functionality.

7. The method of claim 1, wherein the determining the beta number for the FinFET active area of the plurality of FinFET active areas comprises pairing transistors based on at least one of an adjacent location, a connectivity, or an average width of nearby transistors of an opposite conductivity.

8. The method of claim 1, wherein the generating mandrels in the FinFET active area of the plurality of FinFET active areas according to the FinFET active area width comprises generating mandrels in the FinFET active area of the plurality of FinFET active areas according to an un-optimized FinFET active area width.

9. The method of claim 1, further comprising:
   modifying the FinFET active area width using a specified width ratio of FinFET active area width to planar active area width; and
   applying a design priority to resolve a conflict between a modified FinFET active area width and the predetermined beta ratio range.

10. The method of claim 9, wherein applying the design priority comprises readjusting a mandrel in the FinFET active area of the plurality of FinFET active areas.

11. The method of claim 1, further comprising performing a verification operation on the FinFET structure layout for the IC design.

12. A layout generating machine for generating a FinFET structure layout, the layout generating machine comprising:
   a memory storage component having instructions stored thereon; and
   a processor component configured to execute the stored instructions, when executed the stored instructions are configured to cause the layout generating machine to:
      receive a planar structure layout for an integrated circuit (IC) design, the planar structure layout including a plurality of planar active areas;
      generate a plurality of FinFET active areas corresponding to the plurality of planar active areas;

generate mandrels in a FinFET active area of the plurality of FinFET active areas according to a FinFET active area width;

determine a FinFET active area beta number for the FinFET active area of the plurality of FinFET active areas;

determine a planar active area beta number for a planar active area of the plurality of planar active areas corresponding to the FinFET active area of the plurality of FinFET active areas; and adjust the mandrels in the FinFET active area of the plurality of FinFET active areas such that a beta ratio of the FinFET active area beta number to the planar active area beta number is within a predetermined beta ratio range.

13. The layout generating machine of claim 12, wherein the predetermined beta ratio range is from about 0.85 to about 1.15.

14. The layout generating machine of claim 12, wherein the stored instructions are further configured to cause the layout generating machine to adjust the mandrels in the FinFET active area of the plurality of FinFET active areas by one or more of one extending a FinFET active area edge or shifting a mandrel generation point.

15. The layout generating machine of claim 12, wherein the stored instructions are further configured to cause the layout generating machine to adjust the mandrels in the FinFET active area of the plurality of FinFET active areas by increasing the beta ratio by at least one of adding a fin to a p-type FinFET or removing a fin from an n-type FinFET.

16. The layout generating machine of claim 12, wherein the stored instructions are further configured to cause the layout generating machine to adjust the mandrels in the FinFET active area of the plurality of FinFET active areas by decreasing the beta ratio by at least one of adding a fin to an n-type FinFET or removing a fin from a p-type FinFET.

17. The layout generating machine of claim 12, wherein the stored instructions are further configured to cause the layout generating machine to determine a beta number for the FinFET active area of the plurality of FinFET active areas by pairing transistors based on at least one of an adjacent location, a connectivity, or an average width of nearby transistors of an opposite conductivity.

18. The layout generating machine of claim 12, wherein the stored instructions are further configured to cause the layout generating machine to:

modify the FinFET active area width using a specified width ratio of FinFET active area width to planar active area width; and resolve a conflict between a modified FinFET active area width and the predetermined beta ratio range by readjusting a mandrel in the FinFET active area of the plurality of FinFET active areas.

19. A layout generating machine for generating a FinFET structure layout, the layout generating machine comprising:

a memory storage component having instructions stored thereon; and a processor component configured to execute the stored instructions, when executed the stored instructions are configured to cause the layout generating machine to:

receive a planar structure layout for an integrated circuit (IC) design, the planar structure layout including a plurality of planar active areas;

generate a plurality of FinFET active areas corresponding to the plurality of planar active areas;

for a FinFET active area of the plurality of FinFET active areas, calculate a modified FinFET active area width using a specified width ratio of FinFET active area width to planar active area width; and generate mandrels in the FinFET active area of the plurality of FinFET active areas according to the optimal FinFET active area width.

20. The layout generating machine of claim 19, wherein the stored instructions are further configured to cause the layout generating machine to:

determine a FinFET active area beta number for the FinFET active area of the plurality of FinFET active areas;

determine a planar active area beta number for a planar active area of the plurality of planar active areas corresponding to the FinFET active area of the plurality of FinFET active areas; and adjust the mandrels in the FinFET active area of the plurality of FinFET active areas such that a beta ratio of the FinFET active area beta number to the planar active area beta number is within a predetermined beta ratio range.

* * * * *